*(12)* United States Patent
Yoshikawa et al.

(10) Patent No.: US 8,259,196 B2
(45) Date of Patent: Sep. 4, 2012

(54) COMPARATOR, METHOD OF CALIBRATING COMPARATOR, SOLID-STATE IMAGING DEVICE, AND CAMERA SYSTEM

(75) Inventors: Rei Yoshikawa, Kanagawa (JP); Atsushi Suzuki, Kanagawa (JP); Keiji Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 427 days.

(21) Appl. No.: 12/494,865

(22) Filed: Jun. 30, 2009

(65) Prior Publication Data

US 2010/0002120 A1 Jan. 7, 2010

(30) Foreign Application Priority Data

Jul. 3, 2008 (JP) ................. 2008-175023

(51) Int. Cl.
*H04N 5/217* (2011.01)
*H04N 3/14* (2006.01)
*H04N 5/335* (2011.01)
*H04N 5/235* (2006.01)
*H04N 9/64* (2006.01)
*H04N 5/228* (2006.01)

(52) U.S. Cl. ............ 348/241; 348/312; 348/230.1; 348/300; 348/248; 348/222.1

(58) Field of Classification Search ........... 348/312, 348/241, 230.1, 300, 248, 222.1, 294, 243; 327/50
See application file for complete search history.

(56) References Cited

FOREIGN PATENT DOCUMENTS

| JP | 2005-278135 | 10/2005 |
|----|-------------|---------|
| JP | 2008-060872 | 3/2008 |
| JP | 2008-141091 | 6/2008 |

OTHER PUBLICATIONS

Japanese Patent Office Action corresponding to Japanese Serial No. 2008-175023 dated Apr. 20, 2010.
Woodward Yang et al.; An Integrated 800x600 CMOS Imaging System; 1999 IEEE International Solid-State Circuits Conference; Session 17; Paper WA 17.3.

*Primary Examiner* — Jason Chan
*Assistant Examiner* — Stephen Coleman
(74) *Attorney, Agent, or Firm* — SNR Denton US LLP

(57) ABSTRACT

A comparator includes: a signal input terminal; a capacitor connected between the signal input terminal and a signal line; and a switching transistor for calibration which is turned on/off to periodically charge the capacitor with a voltage difference between a signal voltage and an operating point of the comparator, wherein an on-resistance of the switching transistor which is turned on when performing the charging is dynamically controlled by a control pulse having a limited amplitude.

14 Claims, 16 Drawing Sheets

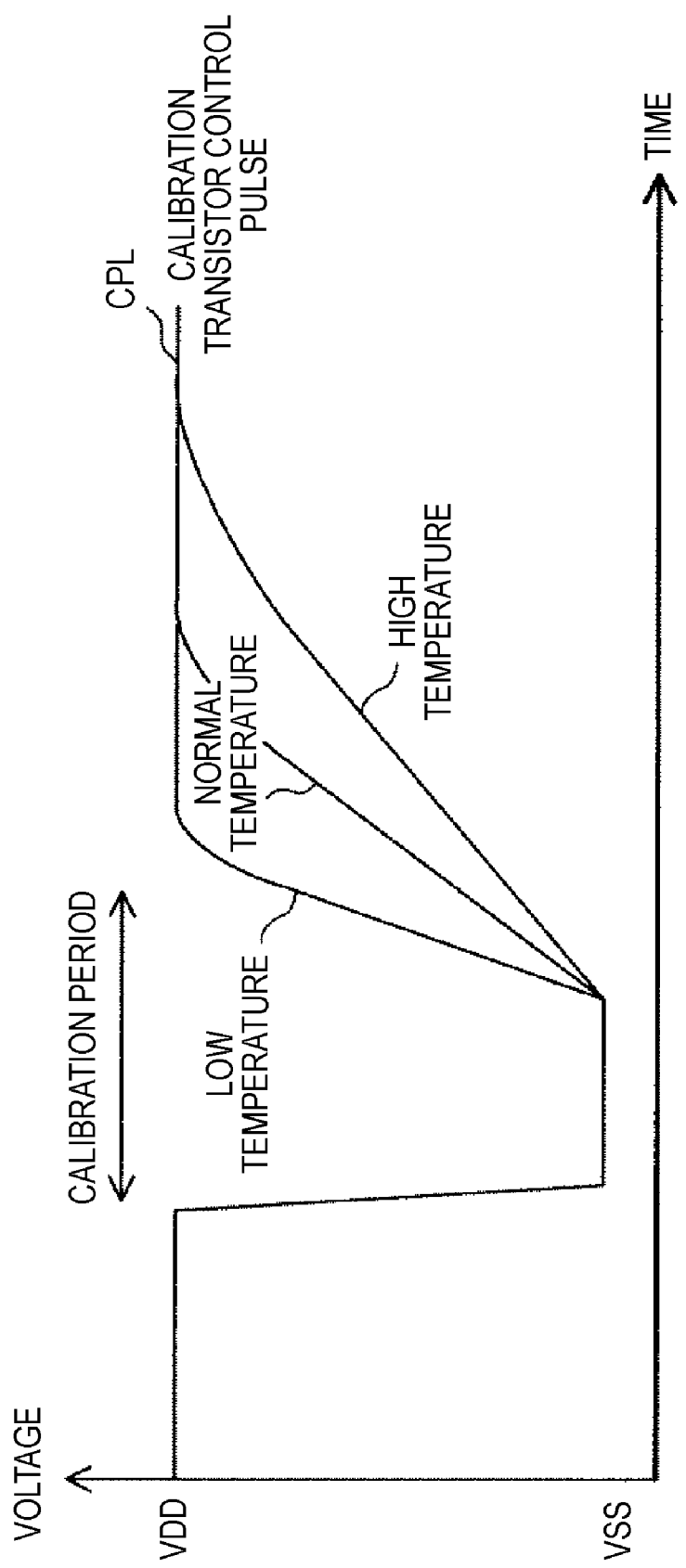

FIG.13

COMPARISON OF OUTPUT STATES AFTER
A/D CONVERSION OF RESET LEVEL

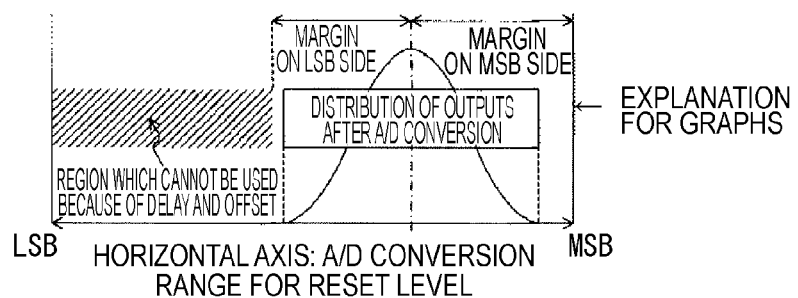

EXPLANATION FOR GRAPHS

LSB HORIZONTAL AXIS: A/D CONVERSION RANGE FOR RESET LEVEL MSB

OUTPUT STATES AFTER A/D CONVERSION OF
RESET LEVEL ACCORDING TO RELATED ART
(OUTPUT STATES ARE OUT OF A/D CONVERSION
RANGE IN CIRCLED REGIONS)

OUTPUT STATES AFTER A/D CONVERSION OF RESET
LEVEL ACCORDING TO EMBODIMENT OF INVENTION
(OUTPUT STATES ARE WITHIN A/D CONVERSION
RANGE UNDER ALL CONDITIONS)

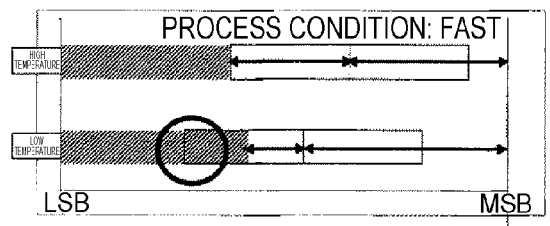
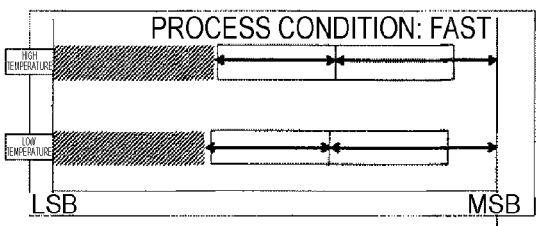
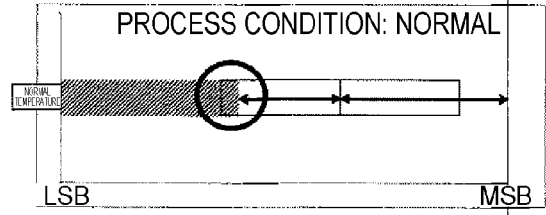
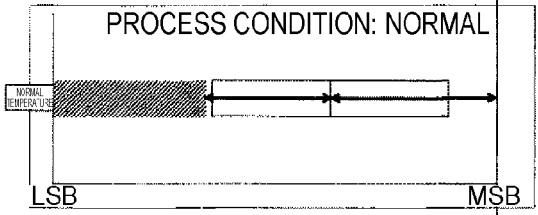
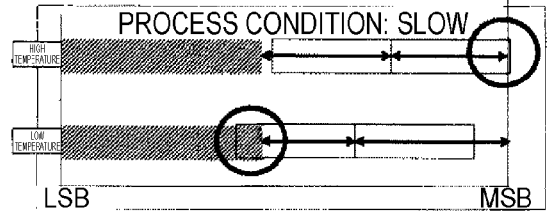
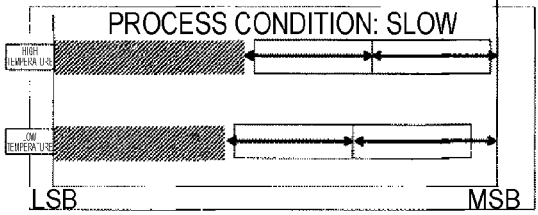

COMPARATOR, METHOD OF CALIBRATING COMPARATOR, SOLID-STATE IMAGING DEVICE, AND CAMERA SYSTEM

BACKGROUND OF THE INVENTION

1. Field of the Invention

The present invention relates to a comparator which can be used in solid-state imaging devices represented by CMOS image sensors, a method of calibrating the comparator, a solid-state imaging device, and a camera system.

2. Description of the Related Art

Recently, CMOS image sensors are attracting attention as solid-state imaging devices (image sensors) which can replace CCDs. The reason is as follows.

The manufacture of CCD pixels requires dedicated processes, and a plurality of power supply voltages are required to operate them. Further, the pixels must be operated in combination with a plurality of peripheral ICs.

On the contrary, various problems encountered in CCDs such as very high system complexity are overcome in CMOS image sensors.

CMOS image sensors can be manufactured using manufacturing processes similar to those used for common CMOS type integrated circuits. The sensors can be driven by a single power supply, and they may employ a single chip on which a mixture of analog circuits and logic circuits manufactured using CMOS processes is provided.

Therefore, CMOS image sensors have a plurality of significant advantages including a reduction in the number of peripheral ICs.

The main stream of CCD output circuits is one channel outputting utilizing an FD amplifier having a floating diffusion (FD).

The main stream of CMOS image sensors is column-parallel output type sensors which have an FD amplifier at each pixel and which provides an output by selecting a certain row of pixels of the pixel array and simultaneously reading the pixels in the column direction.

The reason is as follows. It is difficult to obtain sufficient driving capability with the FD amplifiers provided in the pixels, and a reduction in the data rate is therefore required. Thus, parallel processing is considered advantageous.

A wide variety of signal output circuits for such column-parallel output type CMOS image sensors have been proposed.

Techniques used for reading out a pixel signal from a CMOS image sensor include a method as follows. Signal charge to serve as an optical signal generated by a photoelectric conversion element such as a photodiode is read out after temporarily sampling the charge into a capacitance provided downstream of the element through a MOS switch disposed near the element.

In the sampling circuit, the sampling capacitance value normally has noise that is negatively correlated with the same. When signal charge is transferred from a pixel to the sampling capacitance, the signal charge is completely transferred using a potential gradient, and no noise is therefore generated in this process of sampling. However, noise is generated at the preceding step of resetting the voltage level of the capacitance to a certain reference level.

A common technique for eliminating such a noise is correlated double sampling (CDS). According to the technique, the state of signal charge immediately before sampling (reset level) is read out and stored, and the level of the signal after the sampling is read out. Then, subtraction is carried out between the levels to eliminate a noise.

There is a variety of specific methods for carrying out CDS. A common CMOS image sensor will now be described.

FIG. 1 is a diagram showing an example of a pixel of a CMOS image sensor including four transistors.

For example, a pixel 10 includes a photodiode 11.

The pixel 10 includes four transistors as active elements associated with the single photodiode 11, i.e., a transfer transistor 12, an amplifier transistor 13, a selection transistor 14, and a reset transistor 15.

The photo diode 11 performs photoelectrical conversion of incident light into electrical charge (electrons in this case) in an amount corresponding to the quantity of the light.

The transfer transistor 12 is connected between the photodiode 11 and a floating diffusion FD. A drive signal TR is supplied to the gate (transfer gate) of the transfer transistor 12 through a transfer control line LTx to transfer the electrons obtained by photoelectric conversion at the photodiode 11 to the floating diffusion FD.

The gate of the amplifier transistor 13 is connected to the floating diffusion FD. The amplifier transistor 13 is connected to a signal line LSGN through the selection transistor 14, and the transistor forms a source follower in combination with a constant current source 16 provided outside the pixel.

An address signal SEL is supplied to the gate of the selection transistor 14 through a selection control line LSEL to turn the selection transistor 14 on.

Thus, the amplifier transistor 13 amplifies the potential of the floating diffusion FD and outputs a voltage according to the potential onto an output (vertical) signal line LSGN. A signal voltage thus output from each pixel is output to a pixel signal readout circuit through the signal line LSGN.

The reset transistor 15 is connected between a power supply line LVDD and the floating diffusion FD.

A reset signal RST is supplied to the gate of the reset transistor 15 through a reset control line LRST to reset the potential of the floating diffusion FD to the potential of the power supply line LVDD.

More specifically, the pixel is reset by turning the transfer transistor 12 on to discharge the charge accumulated in the photodiode 11 serving as a photoelectric conversion element. Then, the transfer transistor 12 is turned off, and the photodiode 11 converts an optical signal into electrical charge and accumulate the charge.

Readout is carried out as follows. The reset transistor 15 is turned on to reset the floating diffusion FD. Then, the reset transistor 15 is turned off, and the voltage at the floating diffusion FD at that time is output through the amplifier transistor 13 and the selection transistor 14. The output thus provided is referred to as "P-phase output".

Next, the transfer transistor 12 is turned on to transfer the charge accumulated in the photodiode 11 to the floating diffusion FD, and the voltage at the floating diffusion FD at that time is output through the amplifier transistor 13. The output thus provided is referred to as "D-phase output".

A difference between the D-phase output and the P-phase output is obtained as an image signal. Thus, the image signal can be obtained while eliminating not only variation of a DC component output from each pixel but also FD reset noise at the floating diffusion.

Those operations are simultaneously performed at pixels of each row because the gates of the transfer transistors 12, the selection transistors 14, and the reset transistors 15 are connected on a row-by-row basis.

A wide variety of circuits have been proposed as pixel signal readout (output) circuits for column-parallel output type CMOS image sensors.

One of the most advanced forms of such sensors is a type in which an analog-digital converter (hereinafter abbreviated to "ADC") is provided at each column to obtain a pixel signal in the form of a digital signal.

For example, CMOS image sensors having such column-parallel type ADCs are disclosed in W. Yang et al., "An Integrated 800×600 CMOS Image System" ISSCC Digest of Technical Papers, pp 304-305, February 1999 (Non-Patent Document 1) and JP-A-2005-278135 (Patent Document 1).

FIG. 2 is a block diagram showing an exemplary configuration of a solid-state imaging device (CMOS image sensor) 20 having column-parallel ADCs.

As shown in FIG. 2, the solid-state imaging device 20 includes a pixel section 21, a vertical scan circuit 22, a horizontal transfer scan circuit 23, and a timing control circuit 24.

The solid-state imaging deice 20 further includes an ADC group 25, a digital analog converter (hereinafter referred to as DAC) 26, an amplifier circuit (S/A) 27, and a signal processing circuit 28.

The pixel section 21 is configured by disposing pixels including a photodiode and an in-pixel amplifier, for example, as shown in FIG. 1 in the form of a matrix.

The solid-state imaging device 20 includes control circuits disposed for sequentially reading signals from the pixel section 21, i.e., the timing control circuit 24 which generates an internal clock, the vertical scan circuit 22 which controls row addresses and row scanning, and the horizontal transfer scan circuit 23 which controls column addresses and column scanning.

The ADC group 25 is an array of a plurality of ADCs.

Each ADC includes a comparator 25-1 for performing comparison between a reference voltage Vslop that is a ramp waveform (RAMP) obtained by changing a reference voltage generated by the DAC 26 stepwise and an analog signal obtained from a pixel on each row through the vertical signal line.

Further, each ADC includes a counter 25-2 which counts the comparison time of the comparator 25-1 and a latch 25-3 which holds the result of the counting.

The ADC group 25 has a conversion function to obtain an n-bit digital signal, and one ADC is disposed on each vertical signal line (column line) to form column-parallel ADC blocks.

The output of each latch 25-3 is connected to a horizontal transfer line 29 having a width of, for example, 2n bits.

2n amplifier circuits 27 associated with the horizontal transfer line 29 and a signal processing circuit 28 are provided.

An analog signal (potential Vsl) read out onto a vertical signal line of the ADC group 25 is compared with the reference voltage Vslop (which is a sloped waveform changing with a certain gradient) by the comparator 25-1 disposed at each column.

At this time, the counter 25-2 disposed at each column similarly to the comparator 25-1 operates. The potential (analog signal) Vslop having a ramp waveform and the value of the counter undergo changes in one-to-one correspondence with each other, whereby the potential (analog signal) Vsl on the vertical signal line is converted into a digital signal.

A change in the reference voltage Vslop is converted into a change in time, and the time is counted using a certain period (clock) to convert it into a digital value.

When the analog electrical signal Vsl and the reference voltage Vslop equal to each other, the output of the comparator 25-1 is inverted to stop the clock input to the counter 25-2. Thus, A/D conversion is completed.

When the above-described A/D conversion period ends, the horizontal transfer scan circuit 23 inputs the data held in the latch 25-3 to the signal processing circuit 28 through the horizontal transfer line 29 and the amplifier circuit 27, whereby a two-dimensional image is generated.

A column-parallel output process is performed as thus described.

SUMMARY OF THE INVENTION

As described above, in the CMOS image sensor employing digital CDS (digital correlated double sampling), a reset level of a pixel and a level reached after transfer of an electrical charge generated by a photodiode are sequentially A/D converted.

The CMOS image sensor obtains a digital difference between the two levels to detect a signal generated according to the quantity of light incident thereon.

Each A/D conversion is performed by inputting an output voltage from a pixel input via the vertical signal line and a ramp voltage generated by a DAC to a differential amplifier and measuring the time required for the comparator to be inverted after the input of the ramp voltage is started using a counter.

FIG. 3 is a timing chart of a pixel data read-out operation of the CMOS image sensor shown in FIGS. 1 and 2.

Referring to FIG. 3, RNG1 and RNG2 represent an A/D conversion range for a reset level and an A/D conversion range for a level reached after transfer of an electrical charge from a photodiode, respectively.

T1 represents a calibration period. T2 represents an A/D conversion period of the reset level. T3 represents an A/D conversion period of the level reached after transfer of an electrical charge form a photodiode. CPO represents an output component originating in the quantity of incident light.

DC cut capacitances are inserted between the input terminals of a comparator and a signal line for the purpose of maintaining an optimal A/D conversion range by calibrating a DC-wise offset between two input signals and an operating point of the comparator.

As shown in FIG. 3, the DC cut capacitances are charged to a voltage VB corresponding to the offset during the calibration period before A/D conversion of the reset level.

The calibrating operation is carried out by shorting each of a differential output terminal and an input terminal of the differential comparator with a switching transistor for calibration while the reset level of the pixel and an intermediate code from the DAC are input to the comparator. However, calibration methods according to the related art have had problems as described below.

When calibration is canceled, electric charges are unintentionally injected into the DC cut capacitances because of clock feed-through and charge injection attributable to control pulses for turning off the switching transistors for calibration.

As a result, the two capacitances are not equally charged because of an impedance difference between the DAC and the vertical signal line and a difference in the number of charge injection sources, and a DC offset can occur in the comparator after the calibration.

FIG. 4 is a diagram for explaining a phenomenon caused by a DC offset generated in a comparator after calibration.

A DC offset generated in a comparator after calibration may cause a phenomenon as described bellow.

When the starting voltage of the ramp voltage is set at a value higher than a voltage during calibration (see <2> in FIG. 4), it is expected that a margin proportionate to such a setting will be provided on an LSB side of the A/D conversion range.

However, when an offset, for example, as indicated by <1> in FIG. 4 occurs in the comparator, the margin on the LSB side is reduced in an amount proportionate to the offset. Thus, a code output after A/D conversion will be shifted accordingly toward the LSB.

Since such an offset itself can be canceled by a digital CDS process, the presence of an offset does not constitute a problem alone.

However, the amount of such an offset inevitably undergoes variations attributable to temperature and process variations because the offset is caused by clock feed-through and charge injection attributable to control pulses. As a result, variation can occur in a code output from a reset level after A/D conversion.

When a code output from a reset level may have variation as described above, it is consequently required to provide a sufficient A/D conversion range in expectation of such variation.

As shown in FIG. 3, in digital CDS, the A/D conversion range RNG2 for the level after transfer of an electrical charge includes the A/D conversion range RNG1 for the reset level therein. Therefore, the impact of an increase in the A/D conversion range RNG1 for the reset level is doubled when viewed in terms of time. That is, the A/D conversion period is significantly increased.

A solution to such a problem according to existing techniques is to prepare a control pulse for switching transistors for calibration with plural levels of driving capability at the design stage and to make the slope of the control pulse as gentle as possible with reference to evaluation data. Another solution is to adjust the starting value of the ramp voltage.

That is, a distribution of output codes including variations thereof has been handled by optimizing the position of the A/D conversion range.

Such a method of adjustment has resulted in no significant problem where a sufficient A/D conversion period is provided to accommodate delays in comparators and variations of output codes.

However, the following problem arises as the operating speed of sensors increases as a result of the trend toward a greater number of pixels and a higher frame rate.

A sensor operating at a higher speed has a reduced A/D conversion period, and variation of an output code resulting from a reset level is not negligible. Thus, it becomes difficult to match the A/D conversion range with variation of the output code of the reset level under all conditions.

It is therefore desirable to provide a comparator in which the amount of an offset and variation of the same, which can result in variation of output codes, is suppressed in comparators to reduce variation of output codes, a method of calibrating the comparator, a solid-state imaging device, and a camera system.

An embodiment of the invention is directed to a comparator including a signal input terminal, a capacitor connected between the signal input terminal and a signal line, a switching transistor for calibration which is turned on/off to periodically charge the capacitor with a voltage difference between a signal voltage and an operating point of the comparator. An on-resistance of the switching transistor which is turned on when performing the charging is dynamically controlled by a control pulse having a limited amplitude.

Another embodiment of the invention is directed to a method of calibration of a comparator, wherein when the switching transistor for calibration that is a field effect transistor is turned on/off by the control pulse to periodically charge the capacitor connected between the signal input terminal and the signal line with the voltage difference between the signal voltage and the operating point of the comparator, the control pulse is supplied such that the control pulse has an amplitude lower than that of a power supply voltage and such that the field effect transistor functions as a switch.

Still another embodiment of the invention is directed to a solid-state imaging device including a pixel section formed by arranging a plurality of pixels performing photoelectric conversion in the form of a matrix and a pixel signal readout circuit reading out pixel signals from each column of the pixel section, the reading being performed in units of a plurality of pixels. The pixel signal readout circuit includes a plurality of comparators which are disposed in association with columns of pixels and which compare a readout signal potential and a reference voltage to output a determination signal and a plurality of counters whose operations are controlled by outputs of the comparators and which count comparison times of the respective comparators associated therewith. Each of the comparators includes a signal input terminal, a capacitor connected between the signal input terminal and a signal line, a switching transistor for calibration which is turned on/off to periodically charge the capacitor with a voltage difference between a signal voltage and an operating point of the comparator. An on-resistance of the switching transistor which is turned on when performing the charging is dynamically controlled by a control pulse having a limited amplitude.

Preferably, a pulse generating portion generating the control pulse is provided. The switching transistor is preferably a field effect transistor. The field effect transistor is turned on by the control pulse to charge the capacitor and turned off to end the charging. The pulse generating portion supplies the control pulse such that the control pulse has an amplitude smaller than that of a power supply voltage and such that the field effect transistor functions as a switch.

Preferably, the pulse generating portion includes a transistor for duplication having the same characteristics as those of the switching transistor for calibration. A gate voltage for turning on the switching transistor for calibration is supplied as the control pulse from the source potential, the gate voltage being a control voltage reflecting a voltage equivalent to a threshold voltage of the switching transistor from the source potential.

Preferably, the pulse generating portion obtains the voltage equivalent to the threshold from a voltage generated at a diode connection of a transistor of the same type as the switching transistor for calibration.

Preferably, the comparator includes: differential transistors including one transistor receiving the reference voltage at the gate thereof and another transistor receiving the signal voltage to perform an operation of comparing the reference voltage and the signal voltage, the transistors having respective control terminals serving as a first signal input terminal and a second input terminal; a first capacitor connected between the control terminal of the one transistor of the differential transistors and an input line for the reference voltage; and a second capacitor connected between the control terminal of the another transistor of the differential transistors and an input line for the signal voltage. The switching transistor for calibration is connected between a node connecting the gate of the one transistor and the first capacitor and the drain of the same transistor and between a node connecting the gate of the another transistor and the second capacitor and the drain of the same transistor to apply the control pulse to each of the gates.

Yet another embodiment of the invention is directed to a camera system including a solid-state imaging device and an optical system forming an image of an object on the solid-state imaging device. The solid-state imaging device includes a pixel section formed by arranging a plurality of pixels performing photoelectric conversion in the form of a matrix and a pixel signal readout circuit reading out pixel signals from each column of the pixel section, the reading being performed in units of a plurality of pixels. The pixel signal readout circuit includes a plurality of comparators which are disposed in association with columns of pixels and which compare a readout signal potential and a reference voltage to output a determination signal and a plurality of counters whose operations are controlled by outputs of the comparators and which count comparison times of the respective comparators associated therewith. Each of the comparators includes a signal input terminal, a capacitor connected between the signal input terminal and a signal line, a switching transistor for calibration which is turned on/off to periodically charge the capacitor with a voltage difference between a signal voltage and an operating point of the comparator. An on-resistance of the switching transistor which is turned on when performing the charging is dynamically controlled by a control pulse having a limited amplitude.

In the embodiments of the invention, the switching transistor for calibration for determining the operating point at which the comparator starts operating is turned on/off to periodically charge the capacitor with a voltage difference between a signal voltage and the operating point of the comparator.

The on-resistance of the switching transistor turning on when charging is dynamically controlled by the control pulse having a limited amplitude.

According to the embodiments of the invention, variation of an output code can be kept small by suppressing the amount and variation of an offset in a comparator which can result in variation of the output code.

BRIEF DESCRIPTION OF THE DRAWINGS

FIG. 12 is a diagram showing that an increase in the current driving capability of transistors attributable to low temperature and process variations can result in a change in the slope of a control pulse;

FIG. 13 is graphs showing results of a comparison of states of reset levels output after A/D conversion according to the embodiment of the invention and the related art;

DESCRIPTION OF THE PREFERRED EMBODIMENTS

Embodiment of the invention will now be described in association with drawings.

Figure 1:
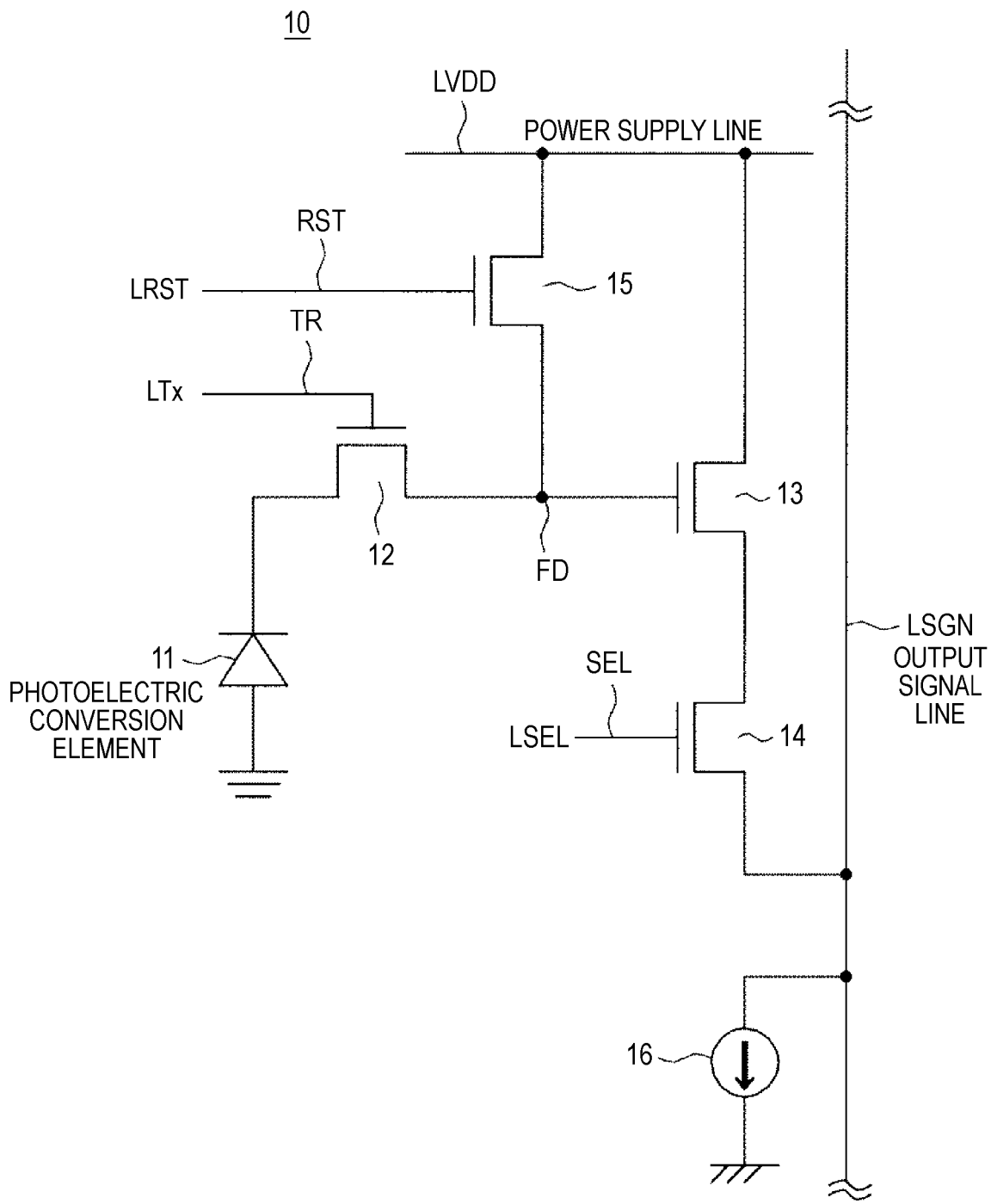
FIG. 1 is a diagram showing an example of a pixel of a CMOS image sensor including four transistors, the pixel including four transistors.
Figure 2:
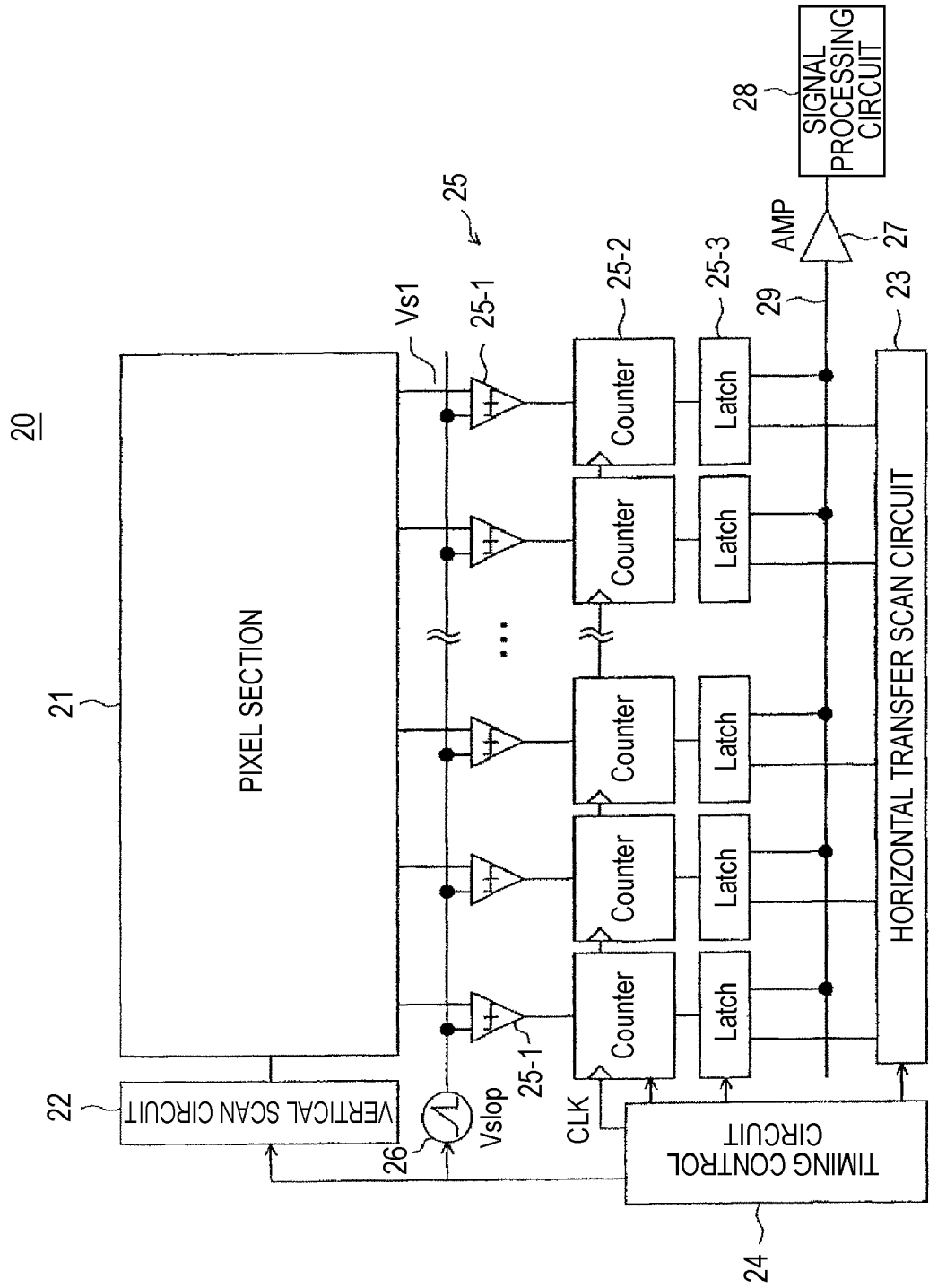
FIG. 2 is a block diagram showing an exemplary configuration of the solid-state imaging device (CMOS image sensor) which has column-parallel ADCs.
Figure 3:
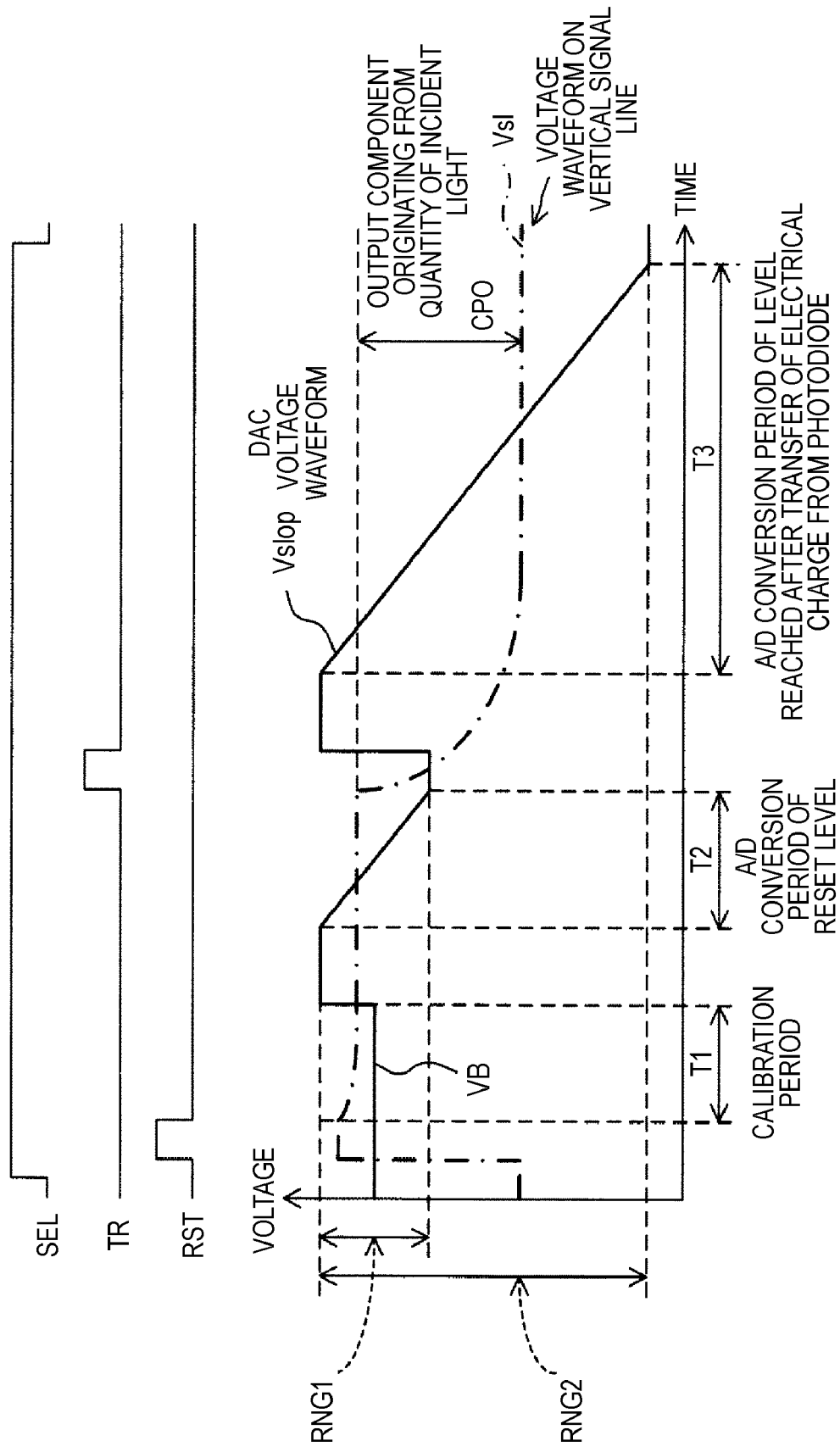
FIG. 3 is a timing chart of a pixel data readout operation of the CMOS image sensor shown in FIGS. 1 and 2.
Figure 4:
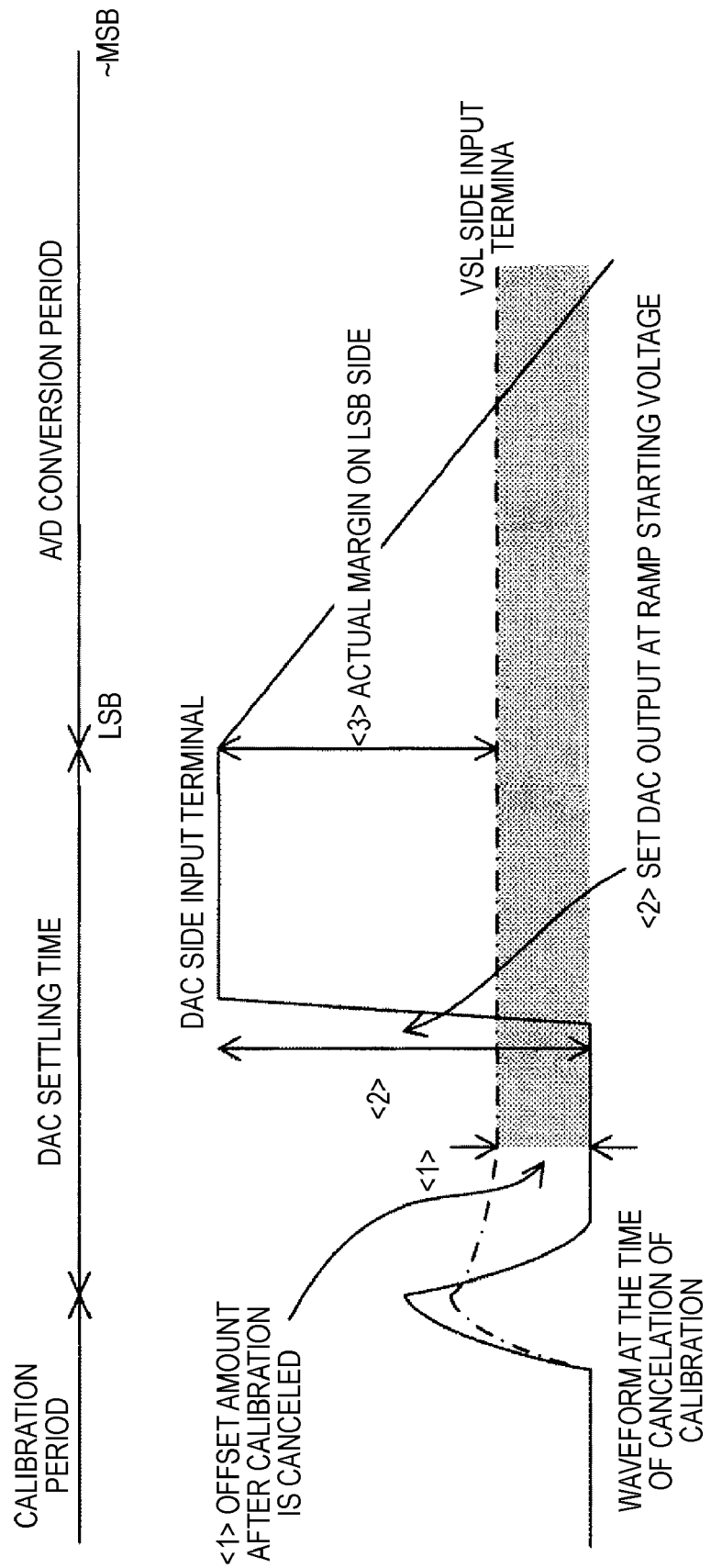
FIG. 4 is a diagram for explaining a phenomenon caused by a DC offset generated in a comparator after calibration.
Figure 5:
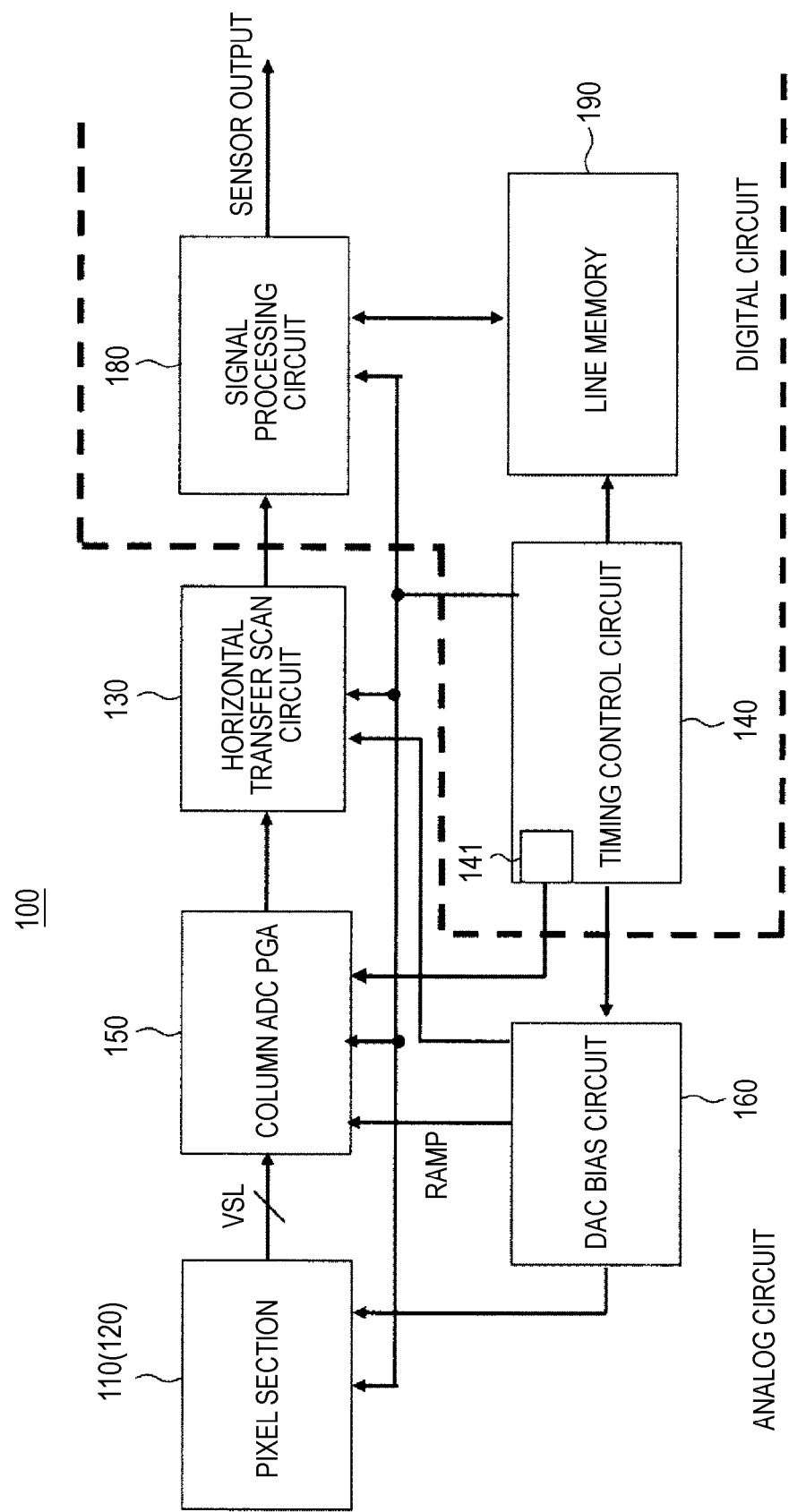
FIG. 5 is a block diagram showing an exemplary configuration of a solid-state imaging device (CMOS image sensor) having column-parallel ADCs according to an embodiment of the invention.

FIG. 5 is a block diagram showing an exemplary configuration of a solid-state imaging device (CMOS image sensor) 100 having column-parallel ADCs according to an embodiment of the invention.

Figure 6:
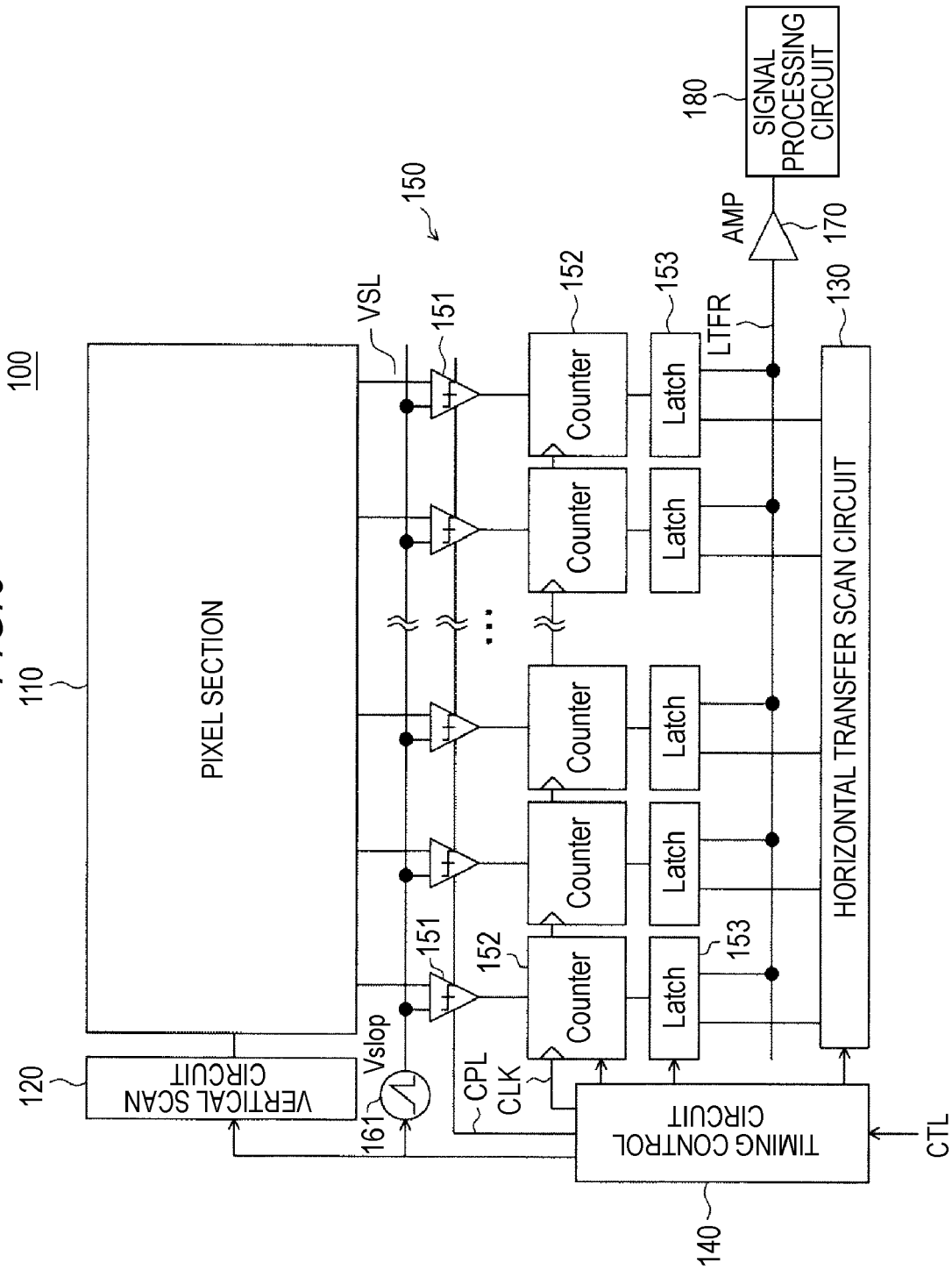
FIG. 6 is a block diagram more specifically showing the ADC group of the solid-state imaging device (CMOS image sensor) having column-parallel ADCs shown in FIG. 3.

FIG. 6 is a block diagram more specifically showing the ADCs of the solid-state imaging device (CMOS image sensor) having column-parallel ADCs in FIG. 5.

As shown in FIGS. 5 and 6, the solid-state imaging device 100 includes a pixel section 110 serving as an imaging section, a vertical scan circuit 120, a horizontal transfer scan circuit 130, and a timing control circuit 140.

The solid-state imaging device 100 further includes an group of ADCs 150 serving as a pixel signal readout circuit, a DAC/bias circuit 160 including a DAC (digital analog converter) 161, an amplifier circuit (S/A) 170, a signal processing circuit 180, and a line memory 190.

Among those constituent elements, the pixel section 110, the vertical scan circuit 120, the horizontal transfer scan circuit 130, the ADC group 150, the DAC/bias circuit 160, and the amplifier circuit (S/A) 170 are analog circuits.

The timing control circuit 140, the signal processing circuit 180, and the line memory 190 are digital circuits.

The pixel section 110 includes a plurality of pixel circuits each including a photodiode and an in-pixel amplifier in the form of a two-dimensional array (matrix) having m rows and n columns.

Figure 7:
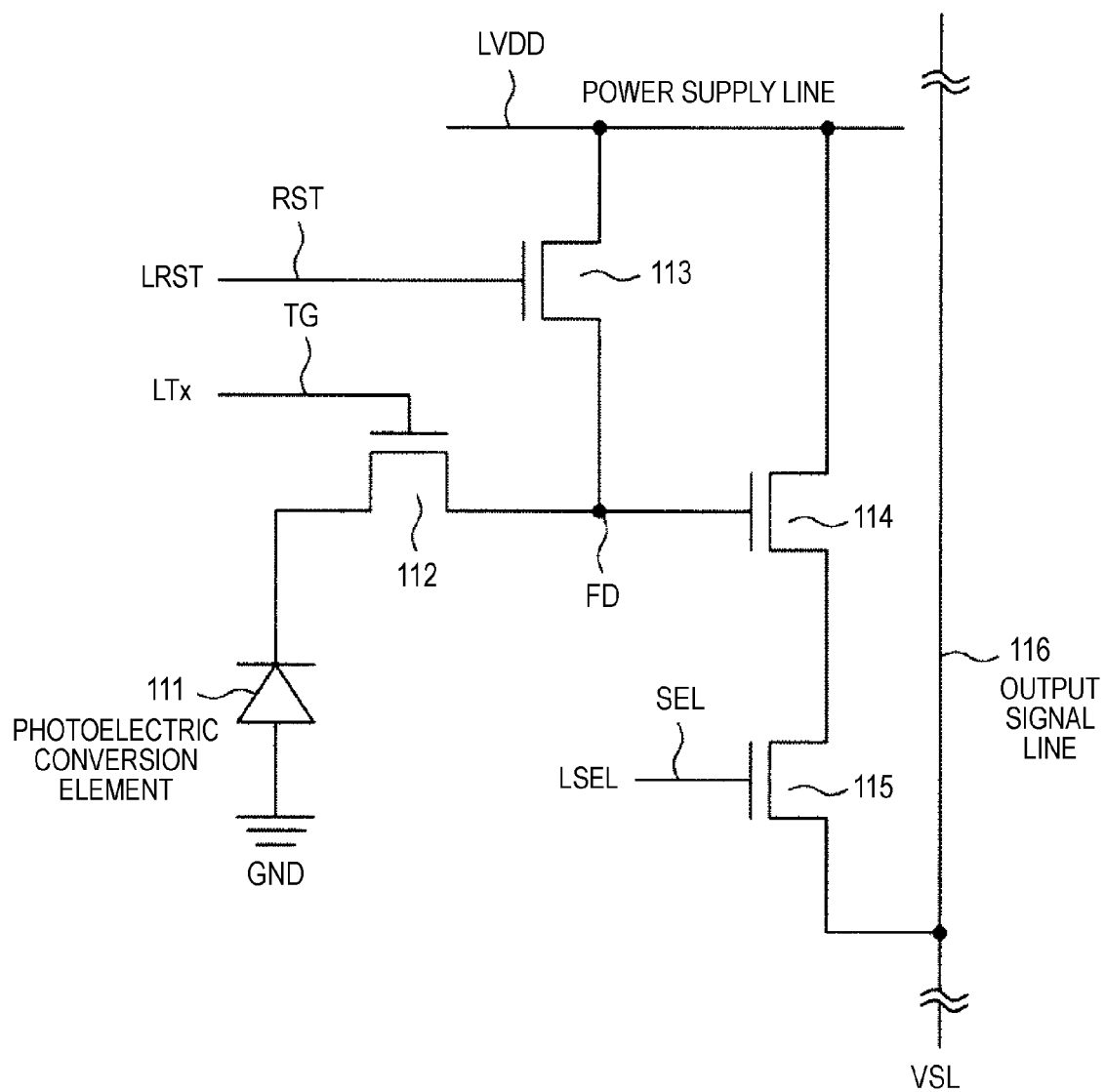
FIG. 7 is a diagram showing an example of a pixel of the CMOS image sensor according to the embodiment, the pixel including four transistors.

FIG. 7 is a diagram showing an example of a pixel of the CMOS image sensor according to the embodiment formed by four transistors.

A pixel circuit 101A includes, for example, a photodiode 111 serving as a photoelectric conversion element.

The pixel circuit 101A includes one photodiode 111 serving as a photoelectric conversion element.

The pixel circuit 101A includes four transistors serving as active elements associated with the single photo-diode 111, i.e., a transfer transistor 112 serving as a transfer element, a reset transistor 113 serving as a reset element, an amplifier transistor 114, and a selection transistor 115.

The photodiode 111 performs photoelectric conversion of incident light into an electrical charge (electrons in this case) having a quantity in accordance with the quantity of the incident light.

The transfer transistor 112 is connected between the photodiode 111 and a floating diffusion FD serving as an output node.

A drive signal TG is applied to a gate (transfer gate) of the transfer transistor 112 through a transfer control line LTx to transfer the electrons obtained by the photoelectric conversion at the photodiode 111 to the floating diffusion FD.

The reset transistor 113 is connected between a power supply line LVDD and the floating diffusion FD.

A reset signal RST is applied to a gate of the reset transistor 113 through a reset control line LRST to reset the potential at the floating diffusion FD to the potential at the power supply line LVDD.

A gate of the amplifier transistor 114 is connected to the floating diffusion FD. The amplifier transistor 114 is connected to a signal line LSGN through the selection transistor 115, and it forms a source follower in combination with a constant current source provided outside the pixel section.

A control signal (an address signal or a select signal) SEL is applied to a gate of the selection transistor 115 through a selection control line LSEL to turn the selection transistor 115 on.

When the selection transistor 115 is turned on, the amplifier transistor 114 amplifies the potential at the floating diffusion FD and outputs a voltage according to the potential to a signal line 116. Voltages thus output from pixels through the signal lines 116 are output to the ADCs 150 serving as a pixel signal readout circuit.

For example, the gates of the transfer transistors 112, the reset transistors 113, and the selection transistors 115 are connected on a row-by-row basis, and those operations are therefore simultaneously performed at the pixels of each row.

The reset control lines LRST, the transfer control lines LTx, and the selection control lines LSEL provided in the pixel section 110 are laid such that one set of those lines serves each row of the pixel array.

The reset control lines LRST, the transfer control lines LTx, and the selection control lines LSEL are driven by the vertical scan circuit 120 serving as a pixel driving section.

The solid-state imaging device 100 includes control circuits disposed to sequentially read out signals from the pixel section 110, i.e., the timing control circuit 140 generating an internal clock, the vertical scan circuit 120 controlling row addresses and row scanning, and the horizontal transfer scan circuit 130 controlling column addresses and column scanning.

The timing control circuit 140 generates timing signals required for signal processing at the pixel section 110, the vertical scan circuit 120, the horizontal transfer scan circuit 130, the ADC group 150, the DAC/bias circuit 160, the signal processing circuit 180, and the line memory 190.

The timing control circuit 140 includes a pulse generating portion 141 generating a control pulse CPL as an initialization signal to be applied to an auto-zero (AZ) switch (hereinafter referred to as "AZ switch") used for calibration or initialization to determine an operating point for each column when comparators of the ADCs start a row operation.

The AZ switch constitutes a switching transistor for calibration.

As will be described later, a comparator used for A/D conversion is a type having a capacitor inserted between an input terminal thereof and a signal line, the capacitor being periodically charged with a voltage difference between a signal voltage and an operating point of the comparator. The AZ switch is an insulated gate field effect transistor which turns on when charging a capacitance and turns off when terminating the charging.

The pulse generating portion 141 generates a control pulse CPL which allows dynamic control of an on resistance of the switch turning on to perform charging.

The control pulse CPL allows the AZ switch to be switched on and off, and the pulse is generated such that its amplitude will be kept above a minimum amplitude required for the switch to function properly.

At the pixel section 110, photons are accumulated and discharged using a line shutter to perform photoelectric conversion of a picture or a screen image on each row of pixels, and resultant analog signals VSL are output to the ADCs.

At the ADC group 150, each ADC block (each column section) performs integration type ADC adapted to APGA and digital CDS of the analog output from the pixel section 110 using a ramp signal RAMP from a DAC 161, thereby outputting a digital signal having a few bits.

The ADC group 150 is an array of a plurality of ADCs.

Each ADC includes a comparator 151 for carrying out comparison between a reference voltage Vslop having a ramp waveform (RAMP) obtained by changing a reference voltage generated by the DAC 161 stepwise and an analog signal (a potential VSL) obtained on each row line from the pixel through a vertical signal line.

Further, each ADC includes a counter 152 for counting the comparison time and a latch 153 for holding the result of the counting.

The ADC group 150 has a conversion function to obtain n-bit digital signals, and they are disposed in association with respective vertical signal lines (column lines) to form column-parallel ADC blocks.

The output of each latch 153 is connected to a horizontal transfer line LTRF which has a width of, for example, 2n bits. 2n amplifier circuits 170 associated with the horizontal transfer line LTRF and a signal processing circuit 180 are provided.

A specific configuration and functions of the comparators 151 will be detailed later.

At the ADC group 150, an analog signal (potential VSL) read out onto a vertical signal line is compared with a reference voltage Vslop (a ramp signal RAMP which is a sloped waveform linearly changing with a certain slope) by a comparator 151 disposed at each column.

At this time, a counter 152 disposed at each column similarly to the comparator 151 operates. The ramp signal RAMP (potential Vslop) having a ramp waveform undergoes changes in one-to-one correspondence with counter values. Thus, the potential (analog signal) VSL on the vertical signal line is converted into a digital signal.

The ADC converts a change in the reference voltage Vslop (ramp signal RAMP) into a temporal change, and the time is then counted using a certain period (clock) to be converted into a digital value.

When the analog signal VSL and the ramp signal RAMP (reference voltage Vslop) agree with each other, the output of the comparator 151 is inverted to stop the input of a clock to the counter 152 or to input a clock which has been stopped to the counter 152, whereby A/D conversion is finished.

After the A/D conversion period terminates as described above, data held is the latch 153 is transferred to the horizontal transfer line LTRF by the horizontal transfer scan circuit 130 and input to the signal processing circuit 180 through the amplifier circuits 170. Predetermined signal processing is performed on the data to generate a two-dimensional image.

The horizontal transfer scan circuit 130 performs simultaneous parallel transfers over several channels in order to achieve a certain transfer rate.

The timing control circuit 140 generates timing required for signal processing at each of blocks such as the pixel section 110 and the ADC group 150.

The signal processing circuit 180 provided downstream performs digital signal processing on signals stored in the line memory 190, including correction of vertical line defects and point defects, signal clamping, parallel/serial conversion, compression, coding, addition, averaging, and intermittent operations.

Digital signals transmitted on each row of pixels are stored in the line memory 190.

In the solid-state imaging device 100 of the present embodiment, digital outputs from the signal processing circuit 180 are transmitted as inputs to an ISP and a baseband LSI.

The ADC group (pixel signal readout circuit) 150 of the present embodiment is configured as described below to achieve improved image quality.

The comparators 151 of the ADC group 150 are configured such that the amount of feed through and the amount of charge injection at non-operating comparators will be prevented from increasing when an AZ (auto-zero) operation is finished due to a failure in the initialization of the non-operating comparators, thereby suppressing an increase in the amount of AC coupling to the RAMP waveform.

In a first exemplary configuration, the comparator 151 provided at each column includes a first amplifier and a second amplifier which are cascade-connected.

The first amplifier is a first stage for performing a signal comparison operation at a low speed to narrow the operation bandwidth, and the second amplifier at the next stage is configured to obtain an increased gain.

A control pulse (initialization signal) CPL is supplied from the pulse generating portion 141 to each comparator 151, the control pulse being applied to an AZ switch for determining an operating point at each column when a row operation is started.

An on-resistance of a switching transistor for calibration which turns on to charge each comparator 151 is dynamically controlled by the control pulse whose amplitude is limited.

The control pulse CPL switches the AZ switch on and off, and the pulse is supplied such that its amplitude is kept above a minimum amplitude required for the switch to function.

For example, the control pulse CPL for switching the AZ switch on and off is supplied with an amplitude which is lower than that of the power supply voltage and which allows the switch to function.

Configurations and functions of a comparator 151 of an ADC group (pixel signal readout circuit) 150 and a pulse generating portion 141 having features characteristic of the present embodiment will now be described in detail along with control exercised over those elements.

The comparator will be indicated by reference numeral 200 in the following description.

Figure 8:
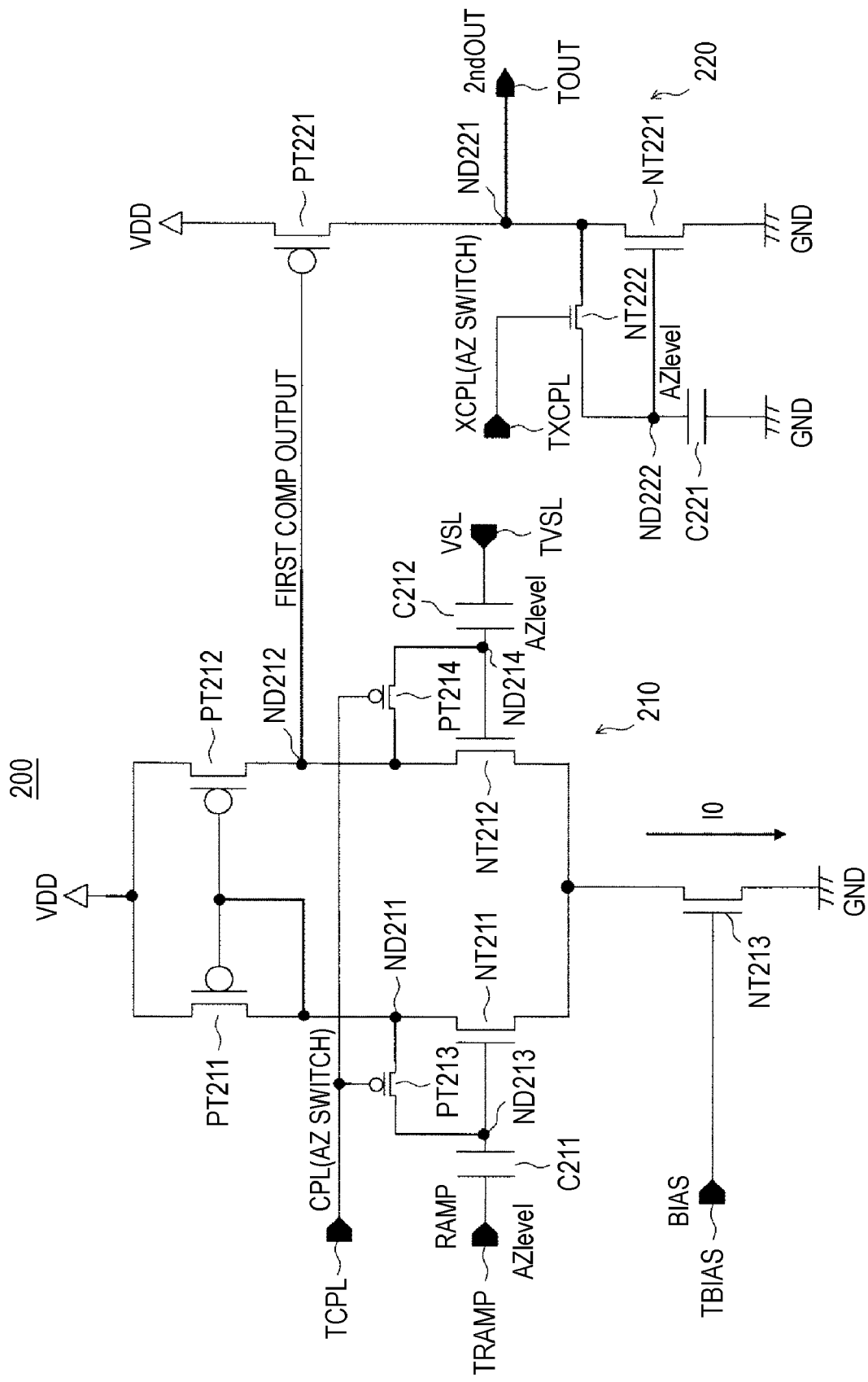
FIG. 8 is a circuit diagram showing an exemplary configuration of a comparator according to the embodiment.

FIG. 8 is a circuit diagram showing an exemplary configuration of the comparator according to the present embodiment.

In the comparator 200, as shown in FIG. 8, a first amplifier 210 that is a first stage to perform a signal comparison operation at a low speed to narrow the operation bandwidth and a second amplifier 220 having the function of increase the gain of an output from the first amplifier 210 are cascade-connected.

The first amplifier 210 includes p-channel MOS (PMOS) transistors PT211 to PT214, n-channel MOS (NMOS) transistors NT211 to NT 213, and a first capacitor C211 and a second capacitor C212 which are sampling capacitances for AZ levels.

The source of the PMOS transistor PT211 and the source of the PMOS transistor PT212 are connected to a power supply potential VDD.

The drain of the PMOS transistor PT211 is connected to the drain of the NMOS transistor NT211, and the connecting point constitutes a node ND211. The drain and gate of the PMOS transistor PT211 are connected, and the connecting point is connected to the gate of the PMOS transistor PT212.

The drain of the PMOS transistor PT212 is connected to the drain of the NMOS transistor NT212, and the connecting point constitutes an output node ND212 of the first amplifier 210.

The emitters of the NMOS transistor NT211 and the NMOS transistor NT212 are connected to each other, and the connecting point is connected to the drain of the NMOS transistor NT213. The source of the NMOS transistor NT213 is connected to a ground potential GND.

The gate of the NMOS transistor NT211 is connected to a first electrode of the capacitor C211, and the connecting point constitutes a node ND213. A second electrode of the capacitor C211 is connected to an input terminal TRAMP for a ramp signal RAMP.

The gate of the NMOS transistor NT212 is connected to a first electrode of the capacitor C212, and the connecting point constitutes a node ND214. A second electrode of the capacitor C212 is connected to an input terminal TVSL for an analog signal VSL.

The gate of the NMOS transistor NT213 is connected to an input terminal TBIAS for a bias signal BIAS.

The source of the PMOS transistor PT213 is connected to the node ND211, and the drain of the transistor is connected to the node ND213. The source of the PMOS transistor PT214 is connected to the node ND212, and the drain of the transistor is connected to the node ND214.

The gates of the PMOS transistors PT213 and PT214 are commonly connected to an input terminal TCPL for a first control pulse CPL which is active at a low level.

In the first amplifier 210 having such a configuration, a current mirror circuit is formed by the PMOS transistors PT211 and PT212.

Further, a differential comparing portion supplied with a current from the NMOS transistor NT213 is formed by the NMOS transistors NT211 and NT212.

The gate of the NMOS transistor NT211 constitutes a first signal input terminal, and the gate of the NMOS transistor NT212 constitutes a second signal input terminal.

The PMOS transistors PT213 and PT214 function as an AZ switch, and the capacitors C211 and C212 function as sampling capacitances for AZ levels.

An output signal 1stcomp from the first amplifier is output from the output node ND212 to the second amplifier 220.

The second amplifier 220 includes a PMOS transistor PT221, NMOS transistors NT221 and NT222, and a sampling capacitor C221 for an AZ level.

The source of the PMOS transistor PT221 is connected to the power supply potential VDD, and the gate of the transistor is connected to output node ND212 of the first amplifier 210.

The drain of the PMOS transistor PT221 is connected to the drain of the NMOS transistor NT221, and the connecting point constitutes an output node ND221.

The source of the NMOS transistor NT221 is connected to the ground potential GND. The gate of the transistor is connected to a first electrode of the capacitor C221, and the connecting point constitutes a node ND222. A second electrode of the capacitor C221 is connected to the ground potential GND.

The drain of the NMOS transistor NT222 is connected to the node ND221, and the source of the transistor is connected to the node ND222.

The gate of the NMOS transistor PT222 is commonly connected to an input terminal TXCPL for a second control pulse XCPL which is active at a high level.

The second control pulse XPCL is at a level complementary to the level of the first control pulse signal CPL supplied to the first amplifier 210.

In the second amplifier 220 having such a configuration, the PMOS transistor PT221 constitutes an input/current source circuit.

The NMOS transistor NT222 functions as an AZ switch, and the capacitor C221 functions as a sampling capacitance for an AZ level.

The output node ND221 of the second amplifier 220 is connected to an output terminal TOUT of the comparator 200.

A configuration and functions of the pulse generating portion 141 will now be described.

Figure 9:
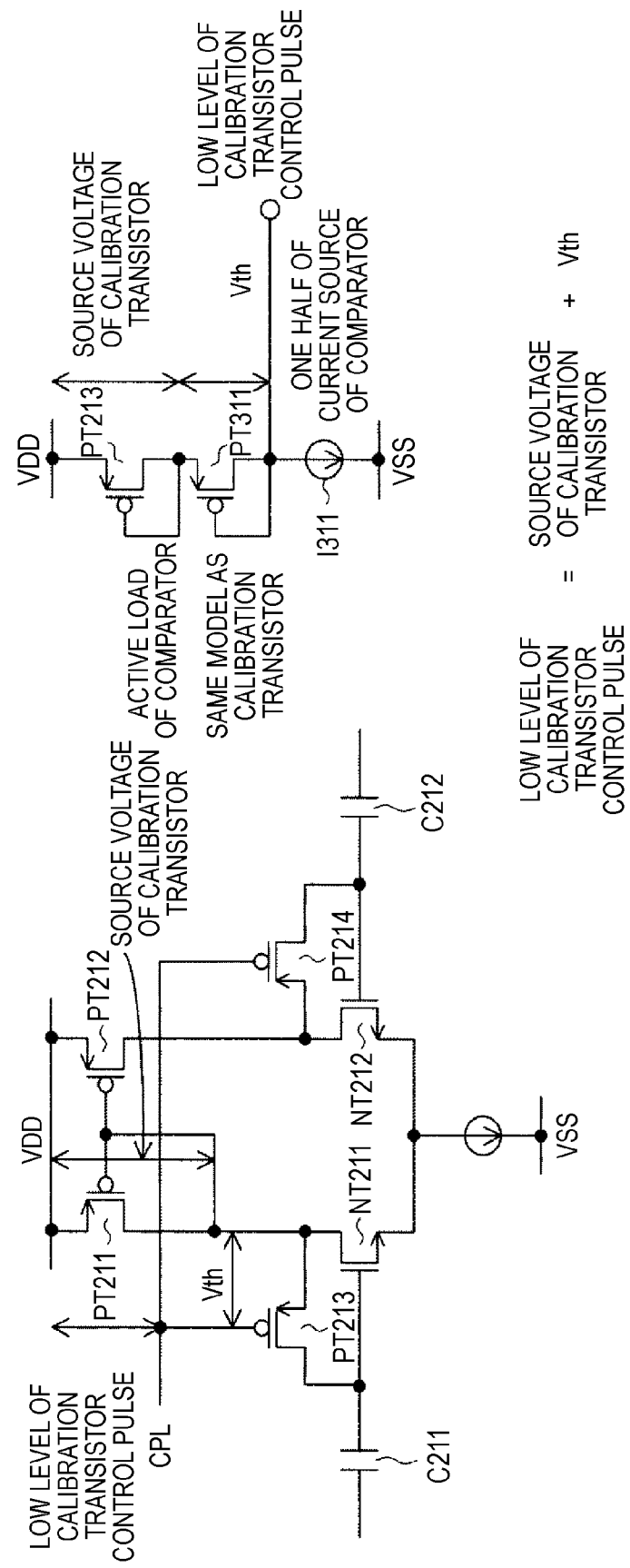
FIG. 9 is a diagram illustrating a conceptual circuit configuration of a pulse generating portion according to the embodiment.
Figure 10:
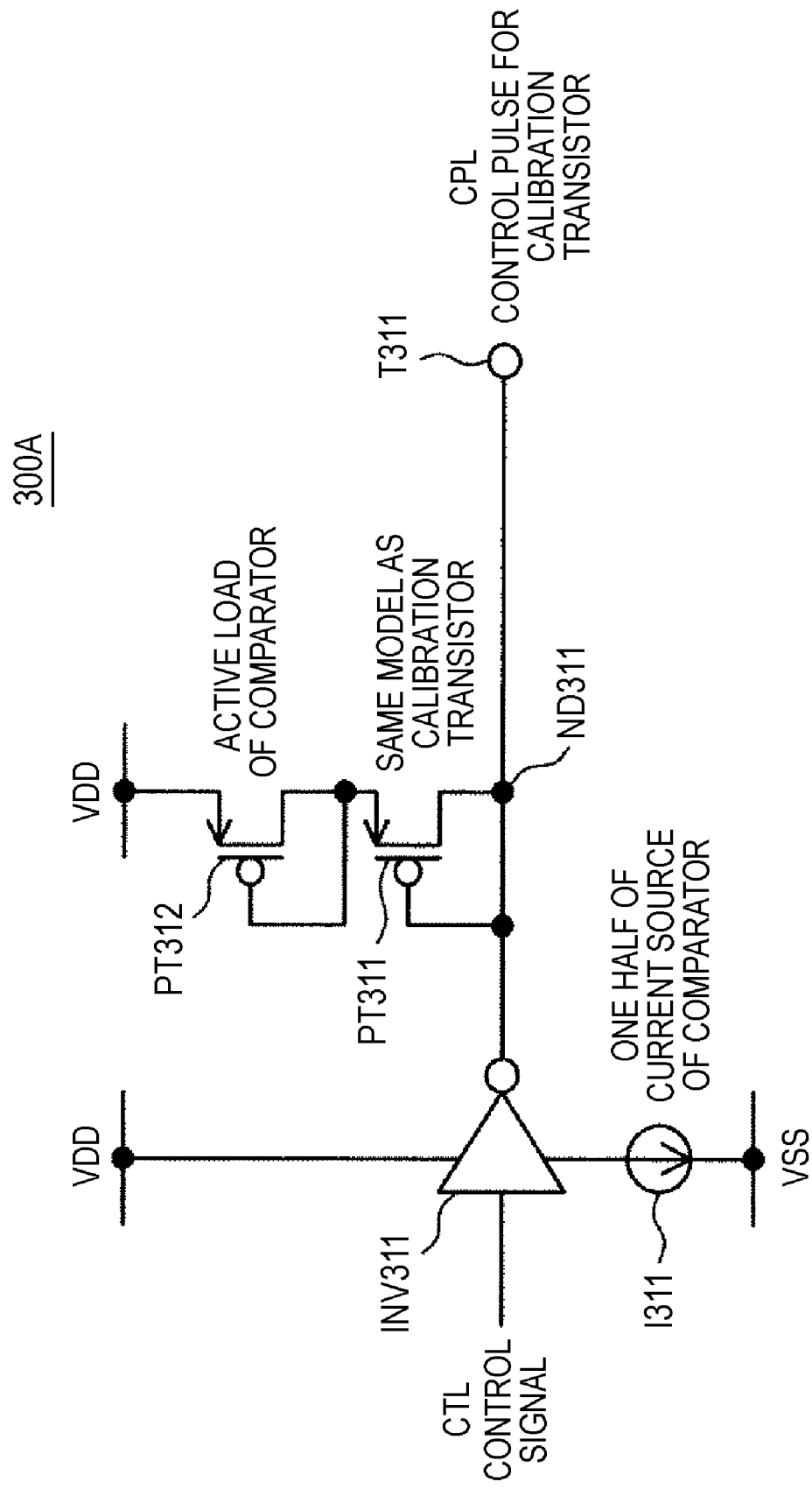
FIG. 10 is a diagram illustrating a specific circuit configuration of the pulse generating portion according to the embodiment.
Figure 11:
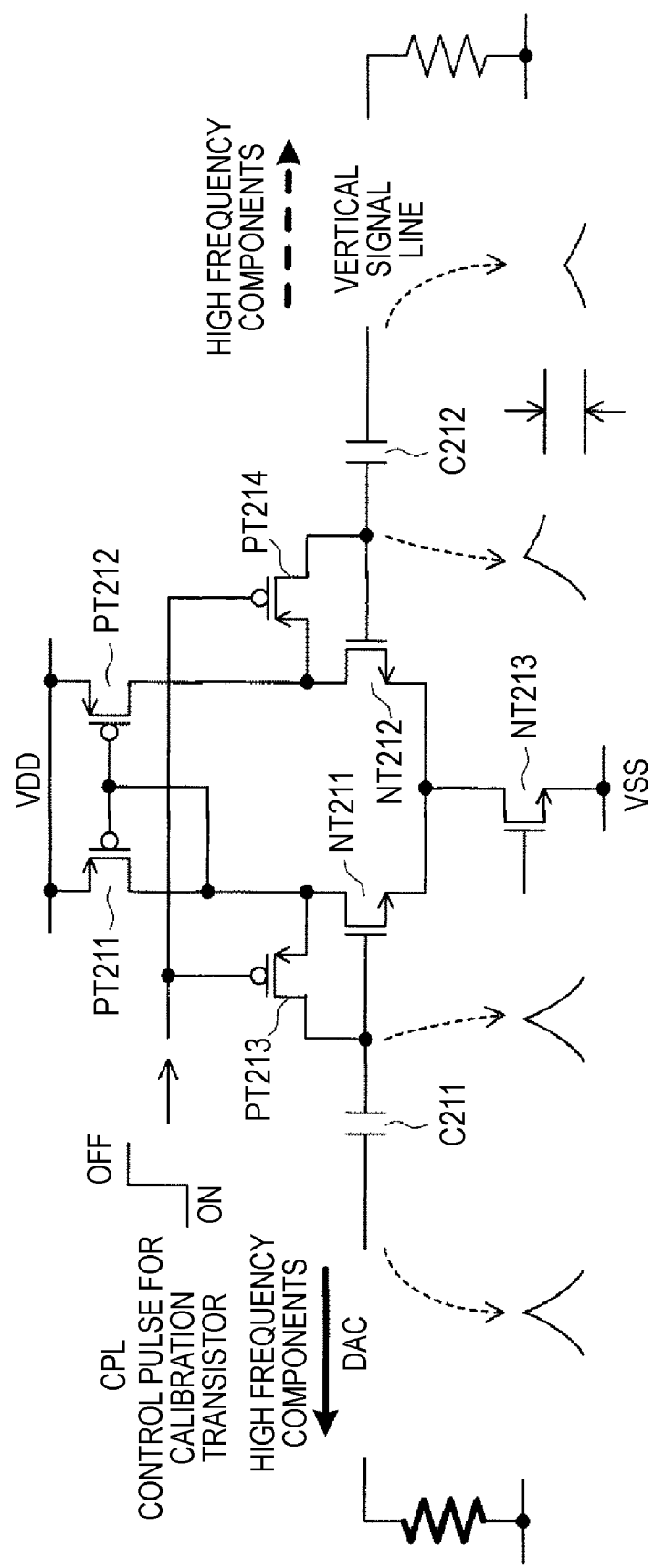
FIG. 11 is a diagram for explaining a phenomenon which occurs when different signal components pass through capacitors serving as DC cut capacitances for a DAC and a vertical signal line.

FIGS. 9 and 10 are diagrams showing an exemplary configuration of the pulse generating portion 141 of the present embodiment. FIG. 9 shows a conceptual circuit configuration of the same, and FIG. 10 shows a specific circuit configuration.

The pulse generating portion will be indicated by reference numeral 300A in the following description.

The pulse generating portion 300A basically includes PMOS transistors PT311 and PT312 which are diode-connected, a current source I311, a node ND311, and an output terminal T311.

The PMOS transistor PT311 is similar in configuration and characteristics to (or configured after the same model as) the PMOS transistors PT213 and PT214 forming the AZ switch of the comparator 200.

The PMOS transistor PT312 is similar in configuration and characteristics to (or configured after the same model as), for example, the PMOS transistor PT211 constituting an active load of the comparator 200.

The current source I311 has a current supplying capacity that is one half the capacity of the current source constituted by the NMOS transistor NT213 of the comparator 200. For example, the current source I311 is constituted by an NMOS transistor which is supplied with a bias signal at the gate thereof.

The drain and gate of the PMOS transistor PT311 are connected to the node ND311.

The source of the PMOS transistor PT311 is connected to the drain and gate of the PMOS transistor PT312.

The source of the PMOS transistor PT312 is connected to the power supply potential VDD.

The current source I311 is connected between the node ND311 and a reference potential VSS, and the node ND311 is connected to the output terminal T311.

In the specific circuit, a control signal CTL is input to an inverter INV311 serving as a buffer connected to the current source I311 and the power supply potential VDD, and the output of the inverter INV311 is connected to the node ND311.

In this pulse generating portion 300A, the source potential of an AZ switching transistor for calibration is duplicated using the same configuration as that of the differential circuit of the comparator 200 to which the AZ switching transistors for calibration are connected.

Further, the pulse generating portion 300A is configured as follows. A control pulse CPL is generated using diode connections of a transistor of the same type as the AZ switching transistors for calibration, the control pulse having an amplitude reflecting a voltage equivalent to the threshold of the transistor. The control pulse CPL thus generated is supplied to the comparator.

In such a configuration, a gate/source voltage Vgs required to turn on the PMOS transistors PT213 and PT214 which are AZ switching transistors for calibration of the comparator 200 can be always supplied at a required minimum value.

As a result, the generation of offsets can be always minimized.

A description will now be made on the reason for providing the control pulse CPL generated by the pulse generating portion 300A with such an amplitude that the voltage Vgs for turning on the PMOS transistors PT213 and PT214 or AZ switching transistors for calibration will be always supplied at a required minimum value.

When calibration is canceled, clock feed through and charge injection substantially evenly occurs at the connecting points between the capacitors C211 and C212 serving as DC cut capacitances and the respective input terminals TRAMP and TVSL of the comparator.

Therefore, when the two signal lines equally behave from an AC-wise point of view, charge injection does not constitute a direct cause of the generation of an offset.

However, it is obvious that the DAC 161 and the vertical signal lines 116 are significantly different from each other in impedance and AC-wise filtering characteristics because of differences between their circuit configurations.

Further, some image sensors are provided with a mode for imaging with a smaller number of pixels in the horizontal direction to reduce the number of comparators operating simultaneously.

In such a case, charge is injected to the vertical signal lines 116 from one comparator regardless of the number of pixels in operation, whereas the number of comparators to inject charge to the DAC 161 varies depending on the mode. Therefore, the relationship between the amounts of charge injected to the DAC and the vertical signal lines varies depending on the mode of operation.

Under the above-described circumstance, signal components passing through the capacitors serving as DC cut capacitances for the DAC and the vertical signal lines are different from each other in practice.

For example, let us assume that the DAC is formed to allow signal components having higher frequencies to pass when compared to the vertical signal lines. Then, a voltage jump occurs at the DAC to the same level as charge injection that occurs when calibration is canceled, whereas the vertical signal lines show smaller reactions.

Such a difference results in a difference in the level of charging of the capacitances, and the difference finally constitutes an offset.

Therefore, as shown in FIG. 12, when the current driving capability of the transistors is enhanced because of a low temperature or process variation, the control pulse has a steeper slope, which results in a tendency toward a greater offset amount.

On the contrary, when the current driving capability is reduced because of a high temperature or process variation, the pulse has a gentler slope, which results in a tendency toward a smaller offset amount.

When such offset fluctuations occur over a wide range, they can constitute a factor which limits the performance of the sensor such as operating speed.

In other words, an increase or decrease in an offset directly becomes a fluctuation in an A/D-converted output. When the A/D conversion period is reduced because of an increase in the number of pixels or an increase in the frame rate, such a fluctuation may disable accurate A/D conversion because of a shortage of the range.

In order to mitigate the problem, the present embodiment employs a method of minimizing the amount of an offset. The reason is that suppression of the amount of an offset itself consequently allows the range of offset fluctuations to be also kept small.

To suppress the amount of an offset, the AZ switching transistors for calibration are turned on with a required minimum gate/source voltage Vgs.

The depth of the inverted channels and the amplitude of the control pulse propagated must be kept small, and there is a need for a mechanism for changing the pulse amplitude in accordance with any change in the target voltage Vgs attributable to process variation or temperature.

In the present embodiment, the amplitude of the control pulse CPL generated by the pulse generating portion 300A is given such that the voltage Vgs for turning on the PMOS transistors PT213 and PT214 serving as AZ switching transistors for calibration is always kept at a required minimum value.

FIG. 13 is graphs showing results of a comparison of states of reset levels output after A/D conversion according to the embodiment of the invention and the related art.

In FIG. 13, A/D conversion ranges are plotted along the horizontal axes, and ranges of distribution of output codes are represented by white bars.

The hatched parts in FIG. 13 represent ranges which cannot be used because of a delay in the comparator and generation of an offset.

The cause of such unusable ranges is as follows. An operation of a comparator has a delay. Therefore, even if the comparator is inverted at the same time when a comparison between a ramp waveform and a readout signal is started, an output code is finalized only after a counter counting the comparison time is advanced in an amount corresponding to the delay.

In practice, the generation of such a delay and offset determines an unusable range.

According to the related art, significant variation of output levels occurs, and the regions enclosed in circles in FIG. 13 are excluded from usable ranges.

On the contrary, the test results of the embodiment of the invention indicate that variation of output levels was effectively suppressed to allow A/D conversion to be performed properly under all conditions.

The pulse generating portion is not limited to the configuration shown in FIGS. 9 and 10, and what is desirable is to use a configuration in which the amplitude of the control pulse always allows the voltage Vgs for turning on the AZ switching transistors for calibration to be given at a required minimum value.

Figure 14:
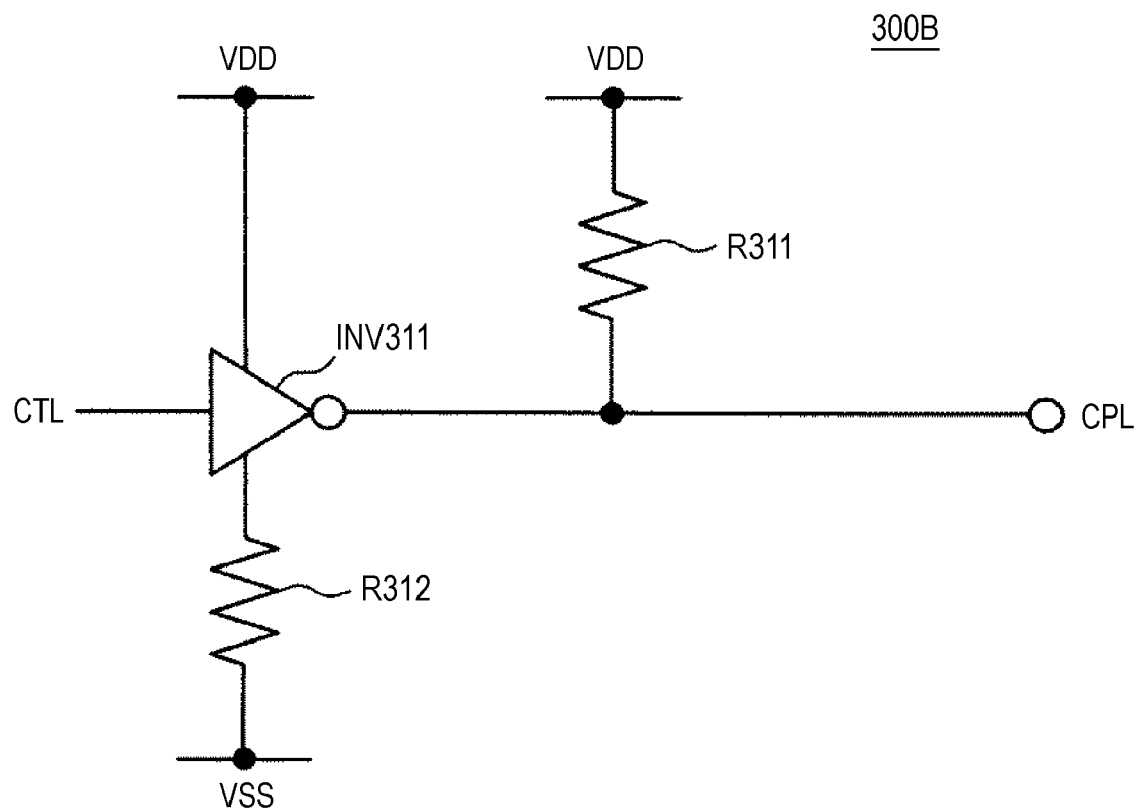
FIG. 14 is a diagram showing another exemplary configuration of a pulse generating portion according to the embodiment.

FIG. 14 is a diagram showing another exemplary configuration of the pulse generating portion according to the present embodiment.

A pulse generating portion 300B shown in FIG. 14 is different from the pulse generating portion 300A shown in FIG. 10 in that a resistive element R311 is connected between the power supply potential VDD and the node ND311 instead of the diode-connected PMOS transistors PT311 and PT312. Further, a resistive element R312 is connected instead of the current source I311 shown in FIG. 10.

A control pulse CPLB generated by the pulse generating portion 300B turns on the transistors for calibration when it is at a low level which is an intermediate potential determined by resistive division instead of the VSS potential.

Operations of the comparator 200 according to the present embodiment will now be described with reference to FIG. 15.

Figure 15:
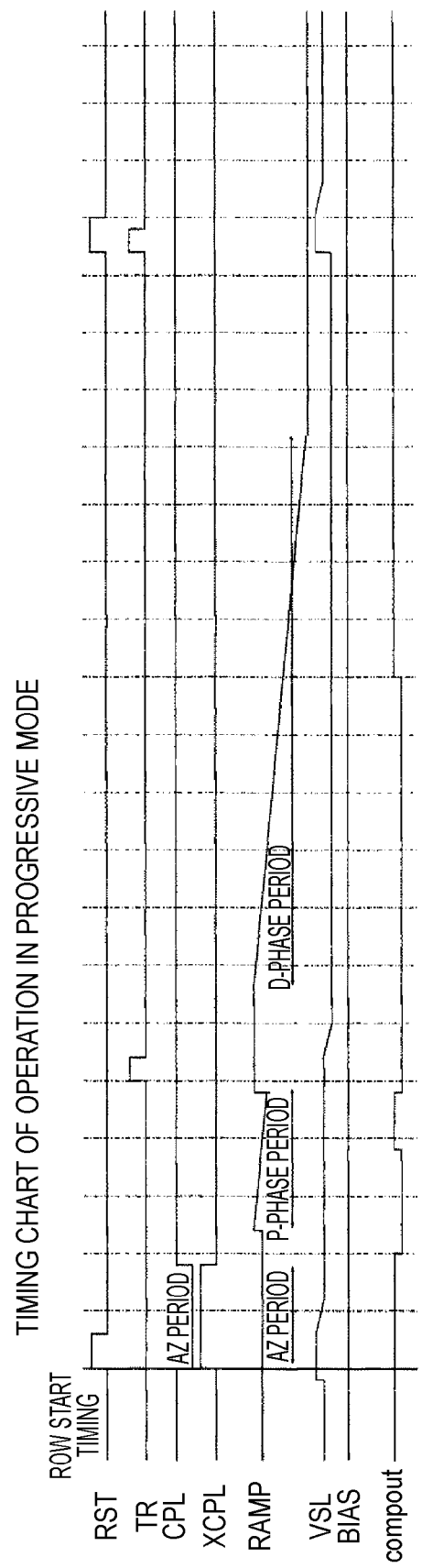
FIG. 15 is a timing chart of a comparator according to the embodiment plotted during an operation in a progressive mode.

FIG. 15 is a timing chart of the comparator according to the present embodiment plotted during an operation in a progressive mode.

In the comparator 200, a first control pulse CPL and a second control pulse XCPL generated by a pulse generating portion 300B are supplied at low and high levels, respectively, to determine an operating point for each column when a row operation is started in a calibration period (AZ period).

Thus, the PMOS transistors PT213 and PT214 serving as an AZ switch for the first amplifier 210 are turned on. Similarly, the NMOS transistor NT222 serving as an AZ switch for the second amplifier 220 is turned on.

At the ADCs 150, a DAC offset level, a pixel reset level, and an AZ level of each column are first sampled using the comparator 200, and the charges are accumulated in the capacitors C211, S212, and C221 serving as AZ level sampling capacitances.

Control pulses CPL supplied from the pulse generating portion during the calibration period have such an amplitude that the voltage Vgs required for turning on the AZ switching transistors for calibration is always given at a required minimum value.

In the present embodiment, the amount of an offset is therefore minimized, and the range of offset fluctuations is consequently suppressed.

Specifically, as shown in the timing chart of FIG. 15, the first control pulse CPL and the second control pulse XCPL are set at the low (L) and high (H) levels, respectively, immediately after the row operation is started, and calibration (auto-zero) is carried out in this pulse period.

A P-phase operation will now be described. The analog signal VSL changes in response to the pixel reset signal RST, and the signal is compared with the ramp signal RAMP from the DAC 161. Thus, A/D conversion is performed at each column.

The output of the comparator 200 changes when agreement occurs between the coupled signals, i.e., the ramp signal RAMP and the analog signal VSL input to the nodes ND213 and ND214 of the first amplifier 210, which have been at a high impedance (HiZ) since the auto-zeroing of the comparator 200. A/D conversion is performed by controlling the operation of the counter provided downstream using the output of the comparator 200.

A P-phase period shown in FIG. 15 is the timing for the above-described operation. The timing chart of FIG. 15 shows that an output signal compout once changes to a low level immediately after the P-phase period starts and changes to a high level when the RAMP wave and the analog signal VSL agree with each other.

A D-phase operation will now be described. While A/D conversion is performed in the same path as for the P-phase, the A/D conversion in the D-phase has a wider dynamic range in general because a signal having a greater amount is photoelectrically converted in the D-phase.

Therefore, when A/D conversion is performed the same gray level as the P-phase RAMP wave in FIG. 15, the D-phase period becomes longer than the P-phase period.

In this case again, the output of the comparator 200 changes when agreement occurs between the coupled signals, i.e., the ramp signal RAMP and the analog signal VSL input to the nodes ND213 and ND214 of the first amplifier 210, which have been at the high impedance (HiZ) since the auto-zeroing of the comparator. A/D conversion operation is performed by controlling the operation of the counter provided downstream using the output of the comparator 200 similarly to the operation in the P-phase.

A D-phase period shown in FIG. 15 is the timing for the above-described operation. The timing chart of FIG. 15 shows that the output signal compout changes to the low level again immediately after the P-phase period ends and changes to the high level when the RAMP wave and the analog signal VSL agree with each other in the D-phase period.

As thus described, each row operation involves an auto-zero operation, a P-phase operation, and a D-phase operation which are performed twice at each column in the same path. Thus, variation and kTC noise specific to each column can be eliminated by analog CDS.

As described above, the present embodiment includes the pixel section 110 which is a matrix-like array of plural pixels performing photoelectric conversion and the pixel signal readout circuit (ADC group) 150 which reads data from the pixel section 110 on a row-by-row basis.

The ADC group (pixel signal readout circuit) 150 includes the plurality of comparators 151 (200) which are disposed in association with columns of pixels and which determine readout signal potentials based on comparison with a reference voltage and output determination signals.

The ADC group 150 includes the plurality of counters 152 whose operations are controlled by output of respective comparator and which count the comparison time of the respective comparators.

When a row operation is started at the comparators 151 (200), the amplitude of a control pulse CPL applied to AZ switches for calibration (initialization) for determining an operating point of each column is given such that a voltage Vgs for turning on AZ switching transistors is always kept at a required minimum value.

For example, the pulse generating portion 300B duplicates the source potential of AZ switching transistors for calibration using the same configuration as that of the differential circuit of the comparator 200 to which the AZ switching transistors for calibration are connected.

Further, the pulse generating portion 300B is configured to generate the control pulse CPL having an amplitude reflecting a voltage equivalent to the threshold of the AZ switching transistors for calibration using a diode connection of a transistor of the same type and to supply the control pulse CPL thus generated to the comparators.

The present embodiment therefore provides the following advantages.

There is a mechanism for controlling the amplitude of the control pulse CPL for the AZ switching transistors for calibration such that the amplitude can be always kept optimal in conjunction with temperature and process variations. It is therefore possible to keep the amount of an offset occurring in a comparator minimized. Consequently, variation of the amount of an offset can be suppressed.

Variation of an output obtained by A/D conversion of a pixel signal is suppressed, which allows a reduction of the range that is absolutely required for A/D conversion. Thus, a signal can be properly processed even if the A/D conversion period is reduced to accommodate a greater number of pixels and to achieve a higher frame rate.

The transistors forming this circuit are provided in such a size that the AZ switching transistors for calibration can be turned on by the voltage Vgs without fail even when there is a maximum deviation of processing accuracy. The device configuration and the bias current are also matched with the comparators.

Therefore, the circuit can operate with stability, and there is no need for a trimming process for achieving the target amplitude level.

The solid-state imaging device having such advantages may be used as an imaging device of a digital camera or a video camera.

Figure 16:
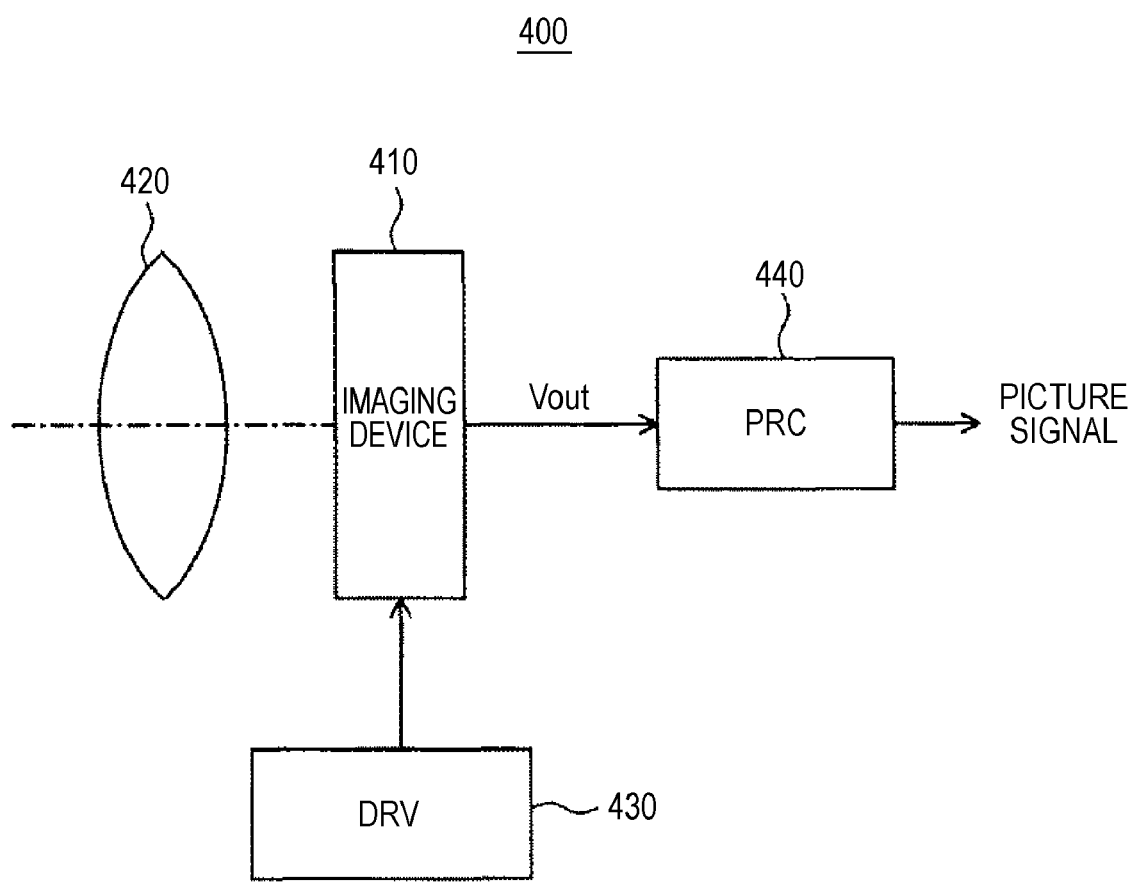
FIG. 16 is an exemplary configuration of a camera system to which the solid-state imaging device according to the embodiment of the invention is applied.

FIG. 16 is a diagram showing a configuration of a camera system 400 to which the solid-state imaging device according to the embodiment of the invention is applied.

As shown in FIG. 16, the camera system 400 includes an imaging device 410 to which the solid-state state imaging device 100 according to the embodiment may be applied.

The camera system 400 includes a lens 420 for forming an image of incident light (image light) on an imaging plane as an optical system for guiding incident light (for forming an image of an object) to a pixel region of the imaging device 410.

The camera system 400 includes a driving circuit (DRV) 430 for driving the imaging device 310 and a signal processing circuit (PRC) 440 for processing signals output by the imaging device 410.

The driving circuit 430 has a timing generator (not shown) for generating various timing signals including start pulses and clock pulses for driving circuits in the imaging device 410. The circuit drives the imaging device 410 with predetermined timing signals.

The signal processing circuit 440 performs predetermined processes on signals output by the imaging device 410.

Image signals processed by the signal processing circuit 440 are recorded in a recording medium such as a memory. Image information recorded in the recording medium is changed into a hard copy by a printer or the like. Image signals processed by the signal processing circuit 440 may alternatively be displayed on a monitor such as a liquid crystal display as moving pictures.

A camera having high precision can be provided by installing the solid-state imaging device 100 as an imaging device 410 in an imaging apparatus such as a digital still camera.

The present application contains subject matter related to that disclosed in Japanese Priority Patent Application JP 2008-175023 filed in the Japan Patent Office on Jul. 3, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A comparator comprising:
   a signal input terminal;
   a reference signal terminal;
   a first capacitor connected between the signal input terminal and a signal line;
   a second capacitor connected between the reference signal terminal and a reference signal;
   a first switching transistor for calibration which is turned on and off to periodically charge the first capacitor with a voltage difference between a signal voltage and an operating point voltage of the comparator, the first switching transistor coupled between the first capacitor and an output signal node; and
   a second switching transistor for calibration which is turned on and off to periodically charge the second capacitor with a voltage difference between a reference signal voltage and the operating point voltage of the comparator, wherein an on-resistance of each of the first and second switching transistors when turned on when performing the charging is dynamically controlled by a control pulse having a limited amplitude, and the control pulse has an amplitude smaller than that of the operating point voltage but large enough to cause the first and second switching transistors to turn on.

2. A comparator according to claim 1, further comprising a pulse generating portion generating the control pulse, wherein:

each of the first and second switching transistors is a field effect transistor;

the first and second switching transistors are turned on by the control pulse to charge the first and second capacitors and turned off to end the charging.

3. A comparator according to claim 2, wherein:

the pulse generating portion includes a transistor for duplication having the same characteristics as those of the first and second switching transistors;

a source potential of the first and second switching transistors is duplicated by the transistor for duplication; and a control voltage equal to a threshold of the first and second switching transistors obtained from the source potential and supplied as the control pulse.

4. A comparator according to claim 3, wherein the pulse generating portion obtains the control voltage from a voltage generated at a diode connection of a transistor of the same type as the first switching transistor for calibration.

5. A comparator according to claim 2, further comprising:

a first differential transistor receiving the signal voltage at the gate thereof;

a second differential transistor receiving the reference signal voltage at the gate thereof;

wherein, the first and second differential transistors compare the reference signal voltage and the signal voltage, the transistors having respective control terminals serving as a first signal input terminal and a second input terminal;

the first capacitor is connected between the gate of the first differential transistor and an input line for the signal voltage, and the second capacitor is connected between the gate of the second differential transistor and the reference signal voltage, the first switching transistor is connected between a node connecting the gate of the first differential transistor and the first capacitor and the drain of the first differential transistor, the second switching transistor is connected between a node connecting the gate of the second transistor and the second capacitor and the drain of the second differential transistor, and the gates of the first and second switching transistors are commonly connected to the control pulse.

6. A method of calibrating a comparator comprising the step of:

providing a comparator comprising (a) a signal input terminal, (b) a reference signal terminal, (c) a first capacitor connected between the signal input terminal and a signal line, (d) a second capacitor connected between the reference signal terminal and a reference signal, (e) a first switching transistor for calibration which is turned on and off to periodically charge the first capacitor with a voltage difference between a signal voltage and an operating point voltage of the comparator, the first switching transistor coupled between the first capacitor and an output signal node; and (f) a second switching transistor for calibration which is turned on and off to periodically charge the second capacitor with a voltage difference between a reference signal voltage and the operating point voltage of the comparator;

causing the first and second switching transistors to switch on and off by applying a common control pulse thereto, wherein an on-resistance of each of the first and second switching transistors when turned on when performing the charging is dynamically controlled by the control pulse, and the control pulse has an amplitude smaller than that of the operating point voltage but large enough to cause the first and second switching transistors to turn on.

7. A method of calibrating a comparator according to claim 6, wherein:

a source potential of the first and second switching transistors is duplicated using a transistor for duplication having the same characteristics as those of the first and second switching transistors; and the control pulse voltage is equal to a threshold voltage of the first and second switching transistors.

8. A method of calibrating a comparator according to claim 7, wherein the voltage equivalent to the threshold voltage of the first and second switching transistors is obtained from a voltage generated at a diode connection of a transistor of the same type as the first switching transistor.

9. A solid-state imaging device comprising:

a pixel section formed by arranging a plurality of pixels performing photoelectric conversion in the form of a matrix; and a pixel signal readout circuit reading out pixel signals from each column of the pixel section, the reading being performed in units of a plurality of pixels, wherein, the pixel signal readout circuit includes (a) a plurality of comparators which are disposed in association with columns of pixels and which compare a readout signal potential and a reference voltage to output a determination signal, and (b) a plurality of counters whose operations are controlled by outputs of the comparators and which count comparison times of the respective comparators associated therewith, each of the comparators includes (a) a signal input terminal, (b) a reference signal terminal, (c) a first capacitor connected between the signal input terminal and a signal line, (d) a second capacitor connected between the reference signal terminal and a reference signal, (e) a first switching transistor for calibration which is turned on and off to periodically charge the first capacitor with a voltage difference between a signal voltage and an operating point voltage of the comparator, the first switching transistor coupled between the first capacitor and an output signal node; and (f) a second switching transistor for calibration which is turned on and off to periodically charge the second capacitor with a voltage difference between a reference signal voltage and the operating point voltage of the comparator, the determination signal is generated at the output signal node, an on-resistance of each of the first and second switching transistors when turned on when performing the charging is dynamically controlled by a control pulse having a limited amplitude, and the control pulse has an amplitude smaller than that of the operating point voltage but large enough to cause the first and second switching transistors to turn on.

10. A solid-state imaging device according to claim 9, further comprising a pulse generating portion generating the control pulse, wherein:
   each of the first and second switching transistors is a field effect transistor; and
   the first and second switching transistors are turned on by the control pulse to charge the first and second capacitors and turned off to end the charging.

11. A solid-state imaging device according to claim 10, wherein:
   the pulse generating portion includes a transistor for duplication having the same characteristics as those of the first and second switching transistors;
   a source potential of the first and second switching transistors is duplicated by the transistor for duplication; and
   a gate voltage for turning on the first and second switching transistors is supplied as the control pulse from the source potential, the gate voltage being equal to a threshold voltage of the first and second switching transistors.

12. A solid-state imaging device according to claim 11, wherein the gate voltage is obtained from a voltage generated at a diode connection of a transistor of the same type as the first switching transistor for calibration.

13. A solid-state imaging device according to claim 9, further comprising:
   a first differential transistor receiving the signal voltage at the gate thereof;
   a second differential transistor receiving the reference signal voltage at the gate thereof;
   wherein
      the first and second differential transistors compare the reference signal voltage and the signal voltage, the transistors having respective control terminals serving as a first signal input terminal and a second input terminal;
      the first capacitor is connected between the gate of the first differential transistor and an input line for the signal voltage;
      the second capacitor is connected between the gate of the second differential transistor and the reference signal voltage,
      the first switching transistor is connected between a node connecting the gate of the first differential transistor and the first capacitor and the drain of the first differential transistor,
      the second switching transistor is connected between a node connecting the gate of the second transistor and the second capacitor and the drain of the second differential transistor, and
      the gates of the first and second switching transistors are commonly connected to the control pulse.

14. A camera system comprising:
a solid-state imaging device; and
an optical system forming an image of an object on the solid-state imaging device,
wherein,
the solid-state imaging device includes (a) a pixel section formed by arranging a plurality of pixels performing photoelectric conversion in the form of a matrix, and (b) a pixel signal readout circuit reading out pixel signals from each column of the pixel section, the reading being performed in units of a plurality of pixels;
the pixel signal readout circuit includes (a) a plurality of comparators which are disposed in association with columns of pixels and which compare a readout signal potential, and (b) plurality of counters whose operations are controlled by outputs of the comparators and which count comparison times of the respective comparators associated therewith;
each of the comparators includes (a) a signal input terminal, (b) a reference signal terminal, (c) a first capacitor connected between the signal input terminal and a signal line, (d) a second capacitor connected between the reference signal terminal and a reference signal, (e) a first switching transistor for calibration which is turned on and off to periodically charge the first capacitor with a voltage difference between a signal voltage and an operating point voltage of the comparator, the first switching transistor coupled between the first capacitor and an output signal node; and (f) a second switching transistor for calibration which is turned on and off to periodically charge the second capacitor with a voltage difference between a reference signal voltage and the operating point voltage of the comparator;
a comparison determination signal is generated at the output signal node;
an on-resistance of each of the first and second switching transistors when turned on when performing the charging is dynamically controlled by a control pulse having a limited amplitude; and
the control pulse has an amplitude smaller than that of the operating point voltage but large enough to cause the first and second switching transistors to turn on.

\* \* \* \* \*